US011868575B2

(12) United States Patent
Yang et al.

(10) Patent No.: US 11,868,575 B2
(45) Date of Patent: *Jan. 9, 2024

(54) ELECTRONIC DEVICE

(71) Applicant: SAMSUNG DISPLAY CO., LTD., Yongin-si (KR)

(72) Inventors: Sung-Jin Yang, Cheonan-si (KR); Hyunsik Park, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/930,731

(22) Filed: Sep. 9, 2022

(65) Prior Publication Data

US 2023/0205379 A1 Jun. 29, 2023

(30) Foreign Application Priority Data

Dec. 24, 2021 (KR) .......................... 10-2021-0186990

(51) Int. Cl.
G06F 3/044 (2006.01)
G06F 3/041 (2006.01)
H10K 59/40 (2023.01)

(52) U.S. Cl.
CPC .......... *G06F 3/0446* (2019.05); *G06F 3/0412* (2013.01); *G06F 3/0443* (2019.05); *H10K 59/40* (2023.02)

(58) Field of Classification Search
None
See application file for complete search history.

(56) References Cited

U.S. PATENT DOCUMENTS

| 10,976,847 | B2 | 4/2021 | Park et al. |
| 10,983,617 | B2 | 4/2021 | Moon et al. |
| 2011/0057893 | A1 | 3/2011 | Kim et al. |
| 2020/0089355 | A1* | 3/2020 | Moon .................. G06F 3/0412 |

FOREIGN PATENT DOCUMENTS

| KR | 10-1082293 | 11/2011 | |
| KR | 10-2019-0137192 | 12/2019 | |
| KR | 10-2020-0033363 | 3/2020 | |
| WO | WO-2016035810 A1 * | 3/2016 | ............. G06F 3/041 |

* cited by examiner

*Primary Examiner* — Duane N Taylor, Jr.
(74) *Attorney, Agent, or Firm* — F. CHAU & ASSOCIATES, LLC

(57) ABSTRACT

An electronic device includes a display panel that displays an image and an input sensor disposed on the display panel and that includes an active area that senses an external input and a peripheral area adjacent to the active area. The input sensor includes a sensing electrode disposed in the active area, a signal line disposed in the peripheral area and electrically connected with the sensing electrode, a ground line disposed further away from the active area than the signal line, a sensing line that includes a first portion that overlaps the ground line, a signal pad disposed in the peripheral area and electrically connected with the signal line, a ground pad connected with the ground line, and a dummy pad disposed adjacent to the ground pad. One end of sensing line is connected with the dummy pad and an opposite end is connected with the ground line.

20 Claims, 17 Drawing Sheets

ELECTRONIC DEVICE

CROSS-REFERENCE TO RELATED APPLICATIONS

This application claims priority under 35 U.S.C. § 119 from Korean Patent Application No. 10-2021-0186990, filed on Dec. 24, 2021 in the Korean Intellectual Property Office, the contents of which are herein incorporated by reference in their entirety.

TECHNICAL FIELD

Embodiments of the present disclosure described herein are directed to an electronic device, and more particularly, to an electronic device that includes an input sensor.

DISCUSSION OF THE RELATED ART

Various electronic devices used in multimedia devices, such as televisions, mobile phones, tablet computers, car navigation units, game machines, and the like, are being developed. The electronic devices include a keyboard, a mouse, or a remote controller as an input device. In addition, many electronic devices include an input sensor, such as a touch panel, as an input device.

SUMMARY

Embodiments of the present disclosure provide an electronic device that detects a defect occurring in wiring of an input sensor.

According to an embodiment, an electronic device includes a display panel that displays an image and an input sensor that is disposed on the display panel and that includes an active area that senses an external input and a peripheral area adjacent to the active area. The input sensor includes a sensing electrode disposed in the active area, a signal line disposed in the peripheral area and electrically connected with the sensing electrode, a ground line disposed in the peripheral area, where the ground line is further away from the active area than the signal line, a sensing line that includes a first portion that overlaps the ground line in a thickness direction of the input sensor, a signal pad disposed in the peripheral area and electrically connected with the signal line, a ground pad disposed in the peripheral area and electrically connected with the ground line, and a dummy pad disposed adjacent to the ground pad. One end of the sensing line is connected with the dummy pad and an opposite end of the sensing line is connected with the ground line.

The display panel may include a display substrate that includes a pixel, an encapsulation substrate that is disposed on the display substrate and that covers the pixel, and a sealing member that bonds the display substrate and the encapsulation substrate to each other. The encapsulation substrate is a base substrate of the input sensor.

The input sensor may further include a base substrate, a first insulating layer disposed on the base substrate, where the sensing electrode is disposed on the first insulating layer, and a second insulating layer disposed on the first insulating layer.

The signal line and the ground line may be disposed on the base substrate, and the sensing line may be disposed on the same layer as the sensing electrode.

The opposite ends of the sensing line is electrically connected with the ground line through a contact hole that penetrates the first insulating layer.

The peripheral area may include a pad area on which the signal pad, the ground pad, and the dummy pad are disposed, and the dummy pad may be disposed at an outermost position in a first direction in the pad area.

The sensing line may further include a second portion that extends from the first portion and that is disposed in the pad area, and at least part of the second portion does not overlap the ground line in the thickness direction.

The dummy pad may include a plurality of dummy pads, and the sensing line may be electrically connected with a dummy pad of the plurality of dummy pads that is closest to the ground pad.

The plurality of dummy pads may be electrically connected together.

The input sensor may further include a guard line disposed on the peripheral area, where the guard line is located between the signal line and the ground line.

The sensing line may include a line portion that connects the one end and the opposite end. The opposite end may make contact with the ground line, and the line portion does not make contact with the ground line.

The display panel may include a thin film encapsulation layer, and the input sensor may be disposed directly on the thin film encapsulation layer.

The sensing electrode may include a first sensing electrode that extends in a first direction and a second sensing electrode that extends in a second direction that crosses the first direction. The signal line may include a first signal line connected with the first sensing electrode and a second signal line connected with the second sensing electrode.

According to an embodiment, an electronic device includes a display panel that displays an image and an input sensor that is disposed on the display panel and that includes an active area that senses an external input and a peripheral area adjacent to the active area. The input sensor includes a sensing electrode disposed in the active area, a signal line disposed in the peripheral area and electrically connected with the sensing electrode, a first ground line and a second ground line spaced apart from each other with respect to the active area and disposed in the peripheral area outward of the signal line, a first sensing line and a second sensing line that overlap the first ground line and the second ground line, respectively, in a thickness direction of the input sensor, a signal pad disposed in the peripheral area and connected with the signal line, a first ground pad and a second ground pad disposed in the peripheral area and connected with the first ground line and the second ground line, respectively, and a first dummy pad and a second dummy pad disposed in the peripheral area adjacent to the first ground pad and the second ground pad, respectively. One end of the first sensing line is connected with the first dummy pad and an opposite end of the first sensing line is connected with the first ground line. One end of the second sensing line is connected with the second dummy pad and an opposite end of the second sensing line is connected with the second ground line.

The input sensor may further include a base substrate on which the signal line and the first and second ground lines are disposed, a first insulating layer that is disposed on the base substrate and on which the sensing electrode and the first and second sensing lines are disposed, and a second insulating layer that is disposed on the first insulating layer and that covers the sensing electrode and the first and second sensing lines.

Opposite ends of the first and second sensing lines may be electrically connected with the first and second ground lines through contact holes formed through the first insulating layer.

The peripheral area may include a pad area in which the signal pad, the first and second ground pads, and the first and second dummy pads are disposed. The first dummy pad and the second dummy pad may be spaced apart from each other in a first direction with respect to the first and second signal pads. The first ground pad may be disposed between the first dummy pad and the signal pad, and the second ground pad may be disposed between the second dummy pad and the signal pad.

The first dummy pad may include a plurality of first dummy pads, and the second dummy pad may include a plurality of second dummy pads. The first sensing line may be electrically connected with a first dummy pad of the plurality of first dummy pads that is closest to the first ground pad, and the second sensing line may be electrically connected with a second dummy pad of the plurality of second dummy pads that is closest to the second ground pad.

According to an embodiment, an electronic device includes a display panel that displays an image and an input sensor that is disposed on the display panel and that includes an active area that senses an external input and a peripheral area adjacent to the active area. The input sensor includes a sensing electrode disposed in the active area, a signal line disposed in the peripheral area and electrically connected with the sensing electrode, a ground line disposed in the peripheral area, where the ground line is further away from the active area than the signal line, a sensing line disposed in the peripheral area and that includes a first portion that overlaps the ground line in a thickness direction of the input sensor, a ground pad disposed in the peripheral area and that is connected with the ground line, and a dummy pad disposed in the peripheral area adjacent to the ground pad. The ground pad and the dummy pad are electrically connected with each other by the sensing line.

One end of the sensing line may be electrically connected with the dummy pad and an opposite end of the sensing line may be electrically connected with the ground line. The opposite end may be opposite to the one end.

DETAILED DESCRIPTION

Figure 1A:
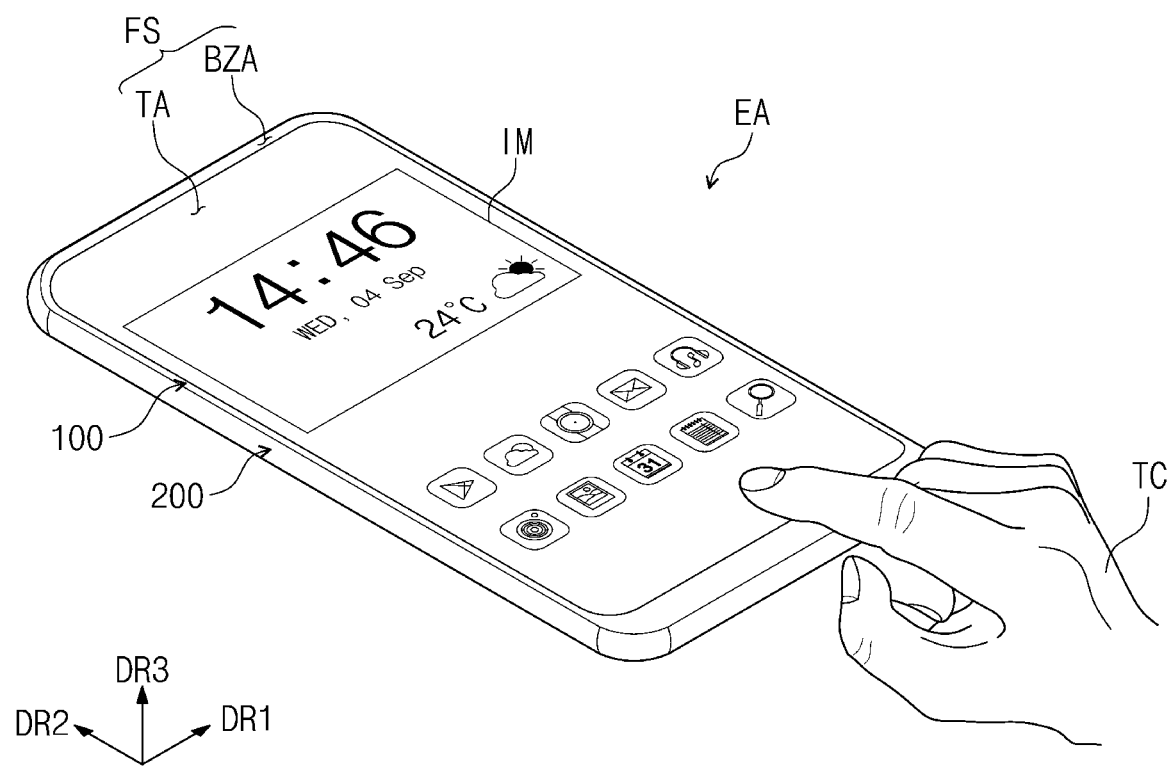
FIG. 1A is a perspective view of an electronic device according to an embodiment of the present disclosure.

When it is mentioned that a component (or, an area, a layer, a part, etc.) is referred to as being "on", "connected to" or "coupled to" another component, the component may be directly on, connected to, or coupled to the other component or a third component may be present therebetween.

Identical reference numerals may refer to identical components.

Hereinafter, embodiments of the present disclosure will be described with reference to the accompanying drawings.

Figure 1B:
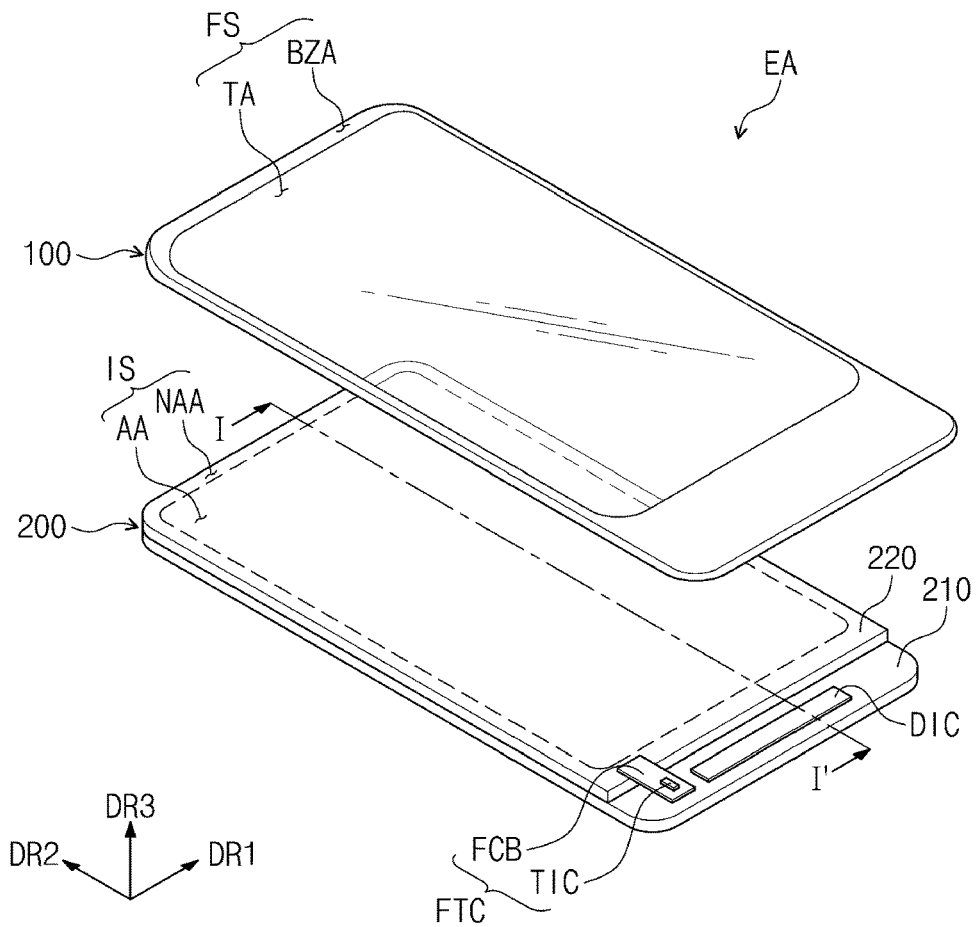
FIG. 1B is an exploded perspective view of an electronic device illustrated in FIG. 1A.
Figure 1C:
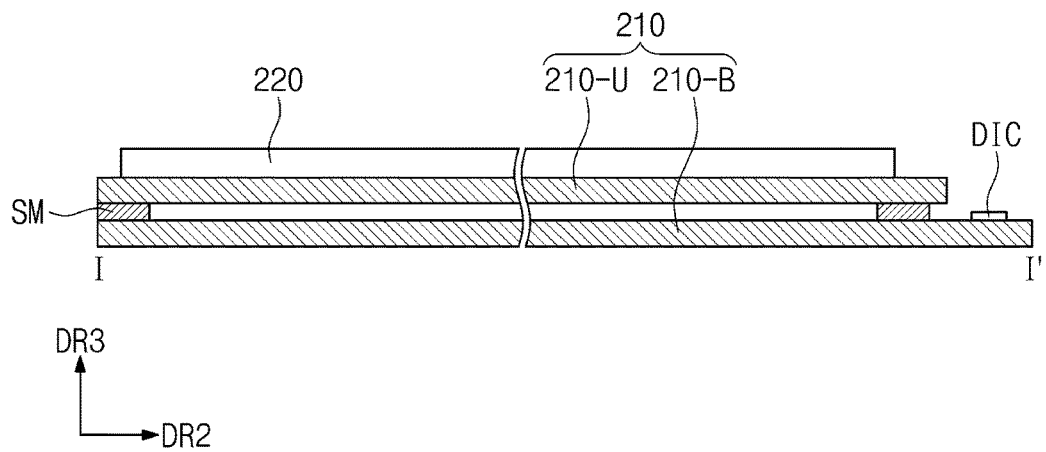
FIG. 1C is a sectional view taken along line I-I' of FIG. 1B.

FIG. 1A is a perspective view of an electronic device EA according to an embodiment of the present disclosure. FIG. 1B is an exploded perspective view of the electronic device EA illustrated in FIG. 1A. FIG. 1C is a sectional view taken along line I-I' of FIG. 1B. The electronic device EA according to an embodiment will be described below with reference to FIGS. 1A to 1C.

Hereinafter, a device that includes two or more electronic parts electrically connected by a conductive bonding structure may correspond to the electronic device described in the present disclosure.

The electronic device EA provides an image. The electronic device EA includes various embodiments. For example, the electronic device EA may be a tablet computer, a notebook computer, a computer, a smart television, etc. In an embodiment, the electronic device EA is a smart phone.

The electronic device EA displays an image IM through a display surface FS. The display surface FS is parallel to a plane defined by a first direction DR1 and a second direction DR2. The normal direction of the display surface FS, that is, the thickness direction of the electronic device EA is indicated by a third direction DR3. Front surfaces, or upper surfaces, and rear surfaces, or lower surfaces, of members or units to be described below are distinguished from each other based on the third direction DR3. Hereinafter, the first to third directions DR1, DR2, and DR3 are defined as directions indicated by first to third directional axes, respectively, and the first to third directional axes are denoted by the same reference numerals as those of the first to third directions.

The display surface FS on which the image IM is displayed corresponds to the front surface of the electronic device EA and to the front surface FS of a window member 100. Hereinafter, the display surface or front surface of the electronic device EA and the front surface of the window member 100 are denoted by the same reference numeral. In FIG. 1A, a clock and a plurality of icons are illustrated as examples of the image IM.

The electronic device EA includes the window member 100 and an electronic panel 200. In addition, the electronic device EA further includes an optical member disposed between the window member 100 and the electronic panel 200. In an embodiment of the present disclosure, the optical member includes at least a polarizer. In an embodiment of the present disclosure, the optical member further includes a retarder. In an embodiment of the present disclosure, the optical member includes a color filter member that lowers the reflectivity of external light.

The window member 100 includes a base panel. The base panel may be implemented with glass, plastic, or a combination thereof. The front surface FS of the window member 100 includes a transmissive area TA and a bezel area BZA. The transmissive area TA is an optically transparent area. For example, the transmissive area TA has a visible light transmittance of about 90% or more.

The bezel area BZA has a lower light transmittance than the transmissive area TA. The bezel area BZA defines the shape of the transmissive area TA. The bezel area BZA is adjacent to the transmissive area TA and surrounds the transmissive area TA. The window member 100 further includes a light blocking pattern disposed on the base panel to define the bezel area BZA.

The bezel area BZA has a predetermined color. The bezel area BZA covers a peripheral area NAA of the electronic panel 200 and reduces visibility of the peripheral area NAA from the outside. However, this is illustrative, and the bezel area BZA may be omitted from the window member 100 according to an embodiment of the present disclosure.

The electronic panel 200 displays the image IM and senses an external input TC. The image IM is displayed on a front surface IS of the electronic panel 200. The front surface IS of the electronic panel 200 includes an active area AA and the peripheral area NAA. The active area AA is activated in response to an electrical signal.

In an embodiment, the active area AA displays the image IM and simultaneously senses the external input TC. The active area AA corresponds to the transmissive area TA, and the peripheral area NAA corresponds to the bezel area BZA. The expression "one area/portion corresponds to another area/portion" used herein means that "the areas/portions overlap each other", but is not necessarily limited to having the same area and/or the same shape.

The electronic panel 200 includes a display panel 210, an input sensor 220, a drive circuit DIC, hereinafter referred to as the first drive circuit, and a circuit module FTC.

The display panel 210 substantially generates the image IM. The display panel 210 may be an organic light emitting display panel or an inorganic light emitting display panel such as a quantum-dot light emitting display panel. The panels are distinguished from each other based on constituent materials of light emitting elements. An emissive layer of an organic light emitting display panel contains an organic light emitting material. An emissive layer of the quantum-dot light emitting display panel contains quantum dots and/or quantum rods. Hereinafter, the display panel 210 will be described as an organic light emitting display panel.

The input sensor 220 senses an externally applied input, such as a touch event. In an embodiment, the input sensor 220 is a capacitive touch sensor, but is not particularly limited.

The first drive circuit DIC is disposed on the display panel 210. The first drive circuit DIC is mounted on the display panel 210. The first drive circuit DIC is electrically connected to the display panel 210 and provides an electrical signal that drives the display panel 210 to the display panel 210.

The circuit module FTC is electrically connected to the input sensor 220. In an embodiment, the circuit module FTC includes a circuit board FCB and a drive circuit TIC. The circuit board FCB is a flexible circuit board. The drive circuit TIC is mounted on the circuit board FCB in a chip-on film form. In an embodiment, the circuit module FTC connects the input sensor 220 and the display panel 210.

In an embodiment of the present disclosure, the drive circuit TIC is omitted, and the circuit module FTC includes only the circuit board FCB. In an embodiment of the present disclosure, the drive circuit IC TIC is mounted on another electronic part. In an embodiment of the present disclosure, a drive circuit of the omitted drive circuit TIC is integrated into the first drive circuit DIC.

In an embodiment of the present disclosure, the circuit board FCB is connected to another circuit board, hereinafter referred to as the main circuit board, without being connected to the display panel 210. The drive circuit TIC is mounted on the main circuit board. The display panel 210 is connected to the main circuit board through another circuit board.

Referring to FIG. 1C, the display panel 210 according to an embodiment includes a display substrate 210-B, an encapsulation substrate 210-U, and a sealing member SM that bonds the display substrate 210-B and the encapsulation substrate 210-U to each other. The display substrate 210-B includes pixels that substantially generate an image. The encapsulation substrate 210-U seals the pixels and prevents damage to the pixels due to external moisture, etc.

The first drive circuit DIC is coupled to the display substrate 210-B. The first drive circuit DIC has the form of an integrated circuit. However, embodiments are not necessarily limited thereto, and in an embodiment of the present disclosure, the first drive circuit DIC is not disposed on the display substrate 210-B.

The display substrate 210-B and the encapsulation substrate 210-U include a glass substrate as a base substrate. The display substrate 210-B has a larger area than the encapsulation substrate 210-U. The first drive circuit DIC is disposed on a partial area of the display substrate 210-B that is exposed by the encapsulation substrate 210-U. However, embodiments are not necessarily limited thereto, and in an embodiment, the display substrate 210-B and the encapsulation substrate 210-U have substantially the same shape and area.

The sealing member SM contains, for example, a frit. The frit is a ceramic adhesive material and that is cured after a laser exposure. The frit contains 15 wt % to 40 wt % of $V_2O_5$, 10 wt % to 30 wt % of $TeO_2$, 1 wt % to 15 wt % of $P_2O_5$, 1 wt % to 15 wt % of BaO, 1 wt % to 20 wt % of ZnO, 5 wt % to 30 wt % of $ZrO_2$, 5 wt % to 20 wt % of $WO_3$, and 1 wt % to 15 wt % of BaO as main ingredients and may contain at least one of $Fe_2O_3$, CuO, MnO, $AL_2O_3$, $Na_2O$, or $Nb_2O_5$ as an additive. A frit that has this composition has a thermal expansion coefficient of $40\times10^{-7}/°$ C. to $100\times10^{-7}/°$ C. and a glass transition temperature of 250° C. to 400° C. The sealing member SM overlaps the peripheral area NAA.

Figure 2A:
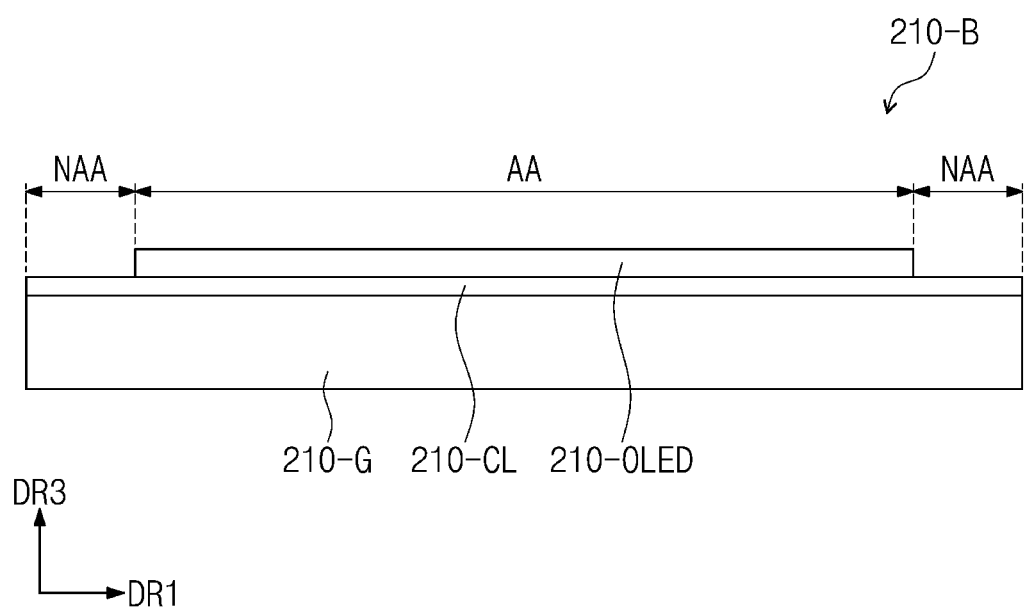
FIG. 2A is a sectional view of a display substrate illustrated in FIGS. 1B and 1C.
Figure 2B:
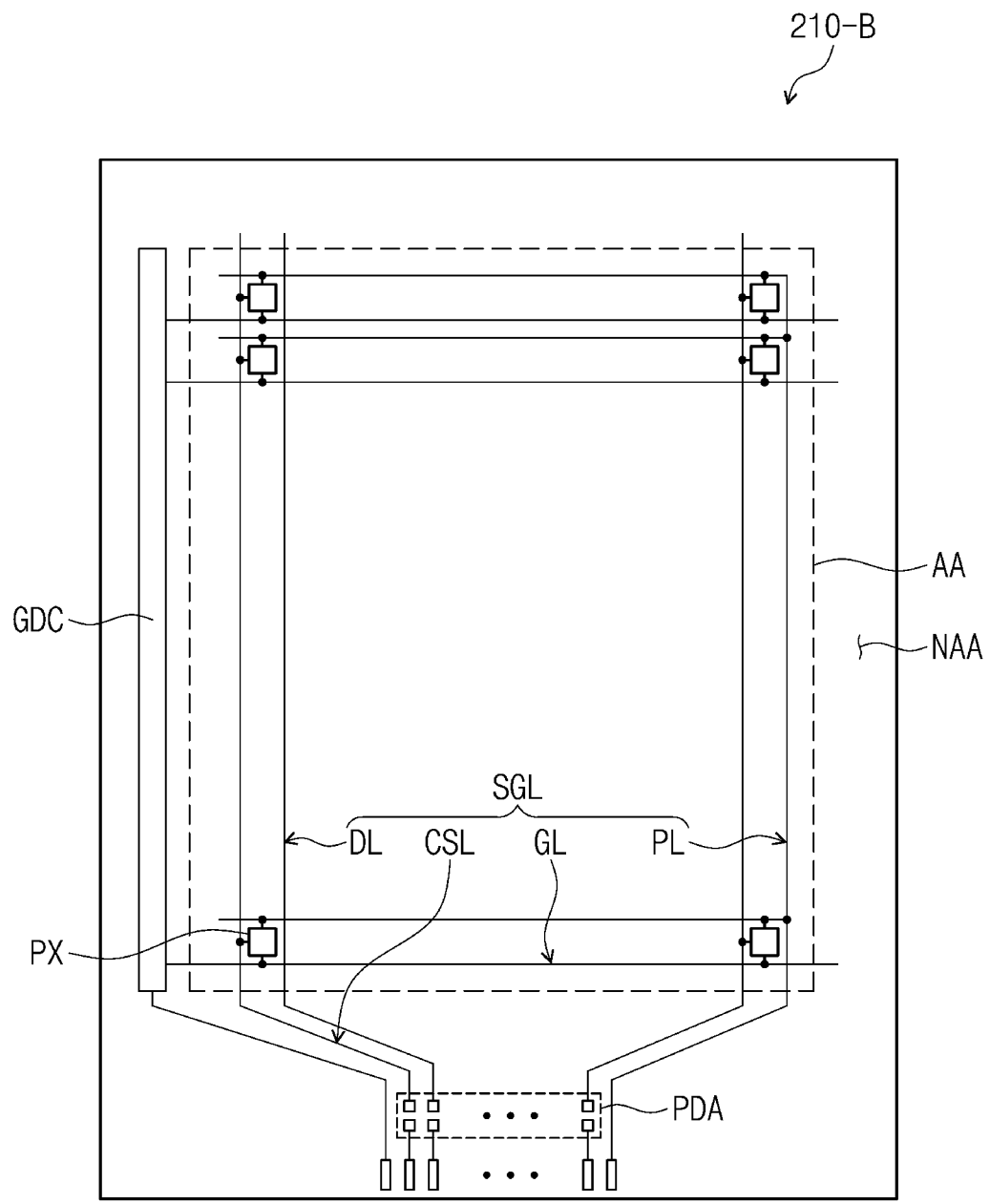
FIG. 2B is a plan view of a display substrate according to an embodiment of the present disclosure.
Figure 2C:
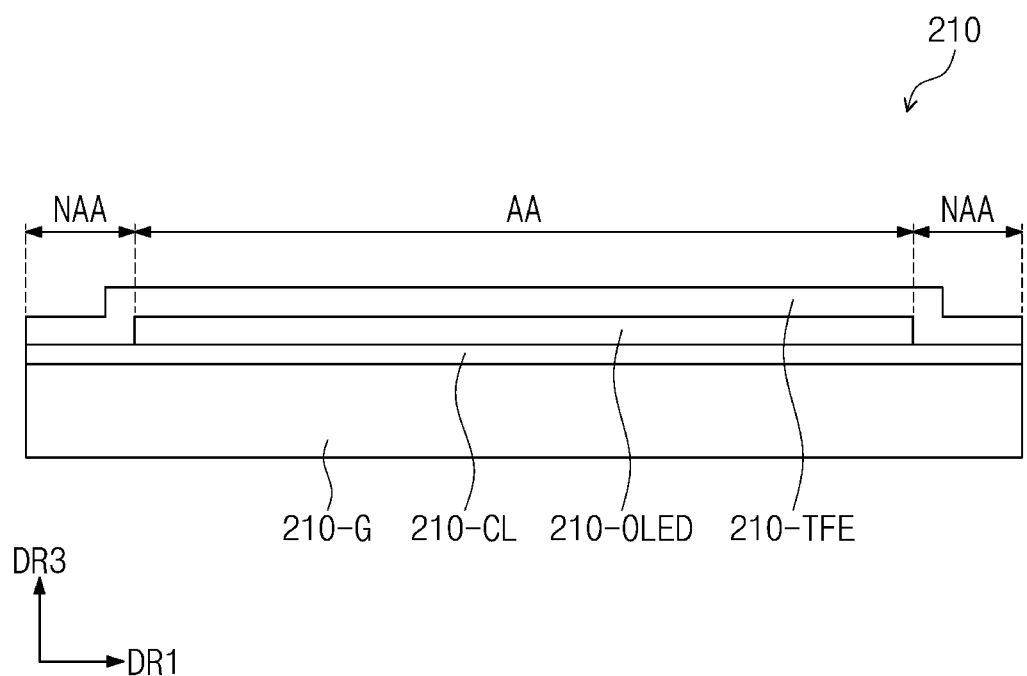
FIG. 2C is a sectional view of a display panel according to an embodiment of the present disclosure.

FIG. 2A is a sectional view of the display substrate 210-B illustrated in FIGS. 1B and 1C. FIG. 2B is a plan view of the display substrate 210-B according to an embodiment of the present disclosure. FIG. 2C is a sectional view of the display panel 210 according to an embodiment of the present disclosure.

As illustrated in FIG. 2A, in an embodiment, the display substrate 210-B includes a base substrate 210-G, hereinafter referred to as the first base substrate, a circuit element layer 210-CL disposed on the first base substrate 210-G, and a display element layer 210-OLED. The display substrate 210-B further includes an insulating layer that covers the display element layer 210-OLED.

The first base substrate 210-G may be at least one of a glass substrate, a metal substrate, or an organic/inorganic composite substrate. The circuit element layer 210-CL includes at least one insulating layer and at least one circuit element. The insulating layer includes at least one inorganic layer and at least one organic layer. The circuit element includes signal lines and a pixel drive circuit. The display element layer 210-OLED includes at least one organic light emitting diode as a light emitting element. The display element layer 210-OLED further includes an organic layer such as a pixel defining film.

As illustrated in FIG. 2B, in an embodiment, the display substrate 210-B includes a drive circuit GDC, hereinafter referred to as the second drive circuit, a plurality of signal lines SGL, hereinafter referred to as the signal lines, and a plurality of pixels PX, hereinafter referred to as the pixels.

The second drive circuit GDC includes a scan drive circuit. The scan drive circuit generates a plurality of scan signals, hereinafter referred to as the scan signals, and sequentially outputs the scan signals to a plurality of scan lines GL, hereinafter referred to as the scan lines, that will be described below. The scan drive circuit may additionally output other control signals to a drive circuit of the pixels PX.

The scan drive circuit includes a plurality of transistors formed through a same process as the drive circuit of the pixels PX, such as a low-temperature polycrystalline silicon (LTPS) process or a low-temperature polycrystalline oxide (LTPO) process.

The signal lines SGL include the scan lines GL, data lines DL, a power line PL, and a control signal line CSL. Each of the scan lines GL is connected to a corresponding pixel PX, and each of the data lines DL is connected to a corresponding pixel PX. The power line PL is connected to the pixels PX. The control signal line CSL provides control signals to the scan drive circuit.

FIG. 2B illustrates a mounting area PDA of the display substrate 210-B on which the first drive circuit DIC (refer to FIG. 1C) is disposed in the form of a chip. The first drive circuit DIC may be connected to the data lines DL.

Referring to FIG. 2C, the display panel 210 according to an embodiment of the present disclosure includes a thin film encapsulation layer 210-TFE that replaces the encapsulation substrate 210-U illustrated in FIG. 1C. The thin film encapsulation layer 210-TFE includes at least one inorganic layer. The thin film encapsulation layer 210-TFE includes a stacked structure of an inorganic layer, an organic layer, and an inorganic layer. The thin film encapsulation layer 210-TFE protects the display element layer 210-OLED from foreign matter such as moisture, oxygen, and dust particles.

Figure 2D:
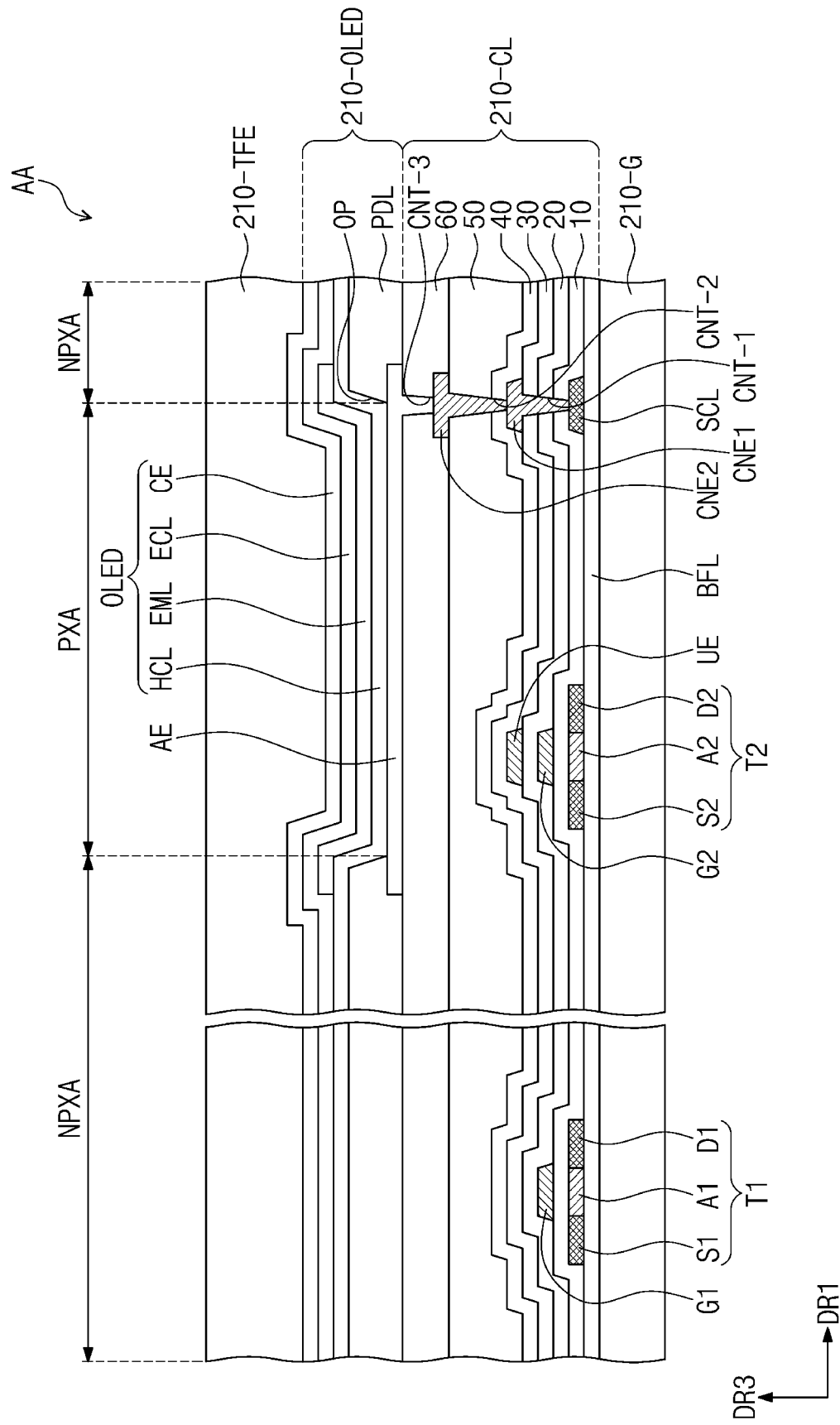
FIG. 2D is an enlarged sectional view of a display panel according to an embodiment of the present disclosure.
Figure 2E:
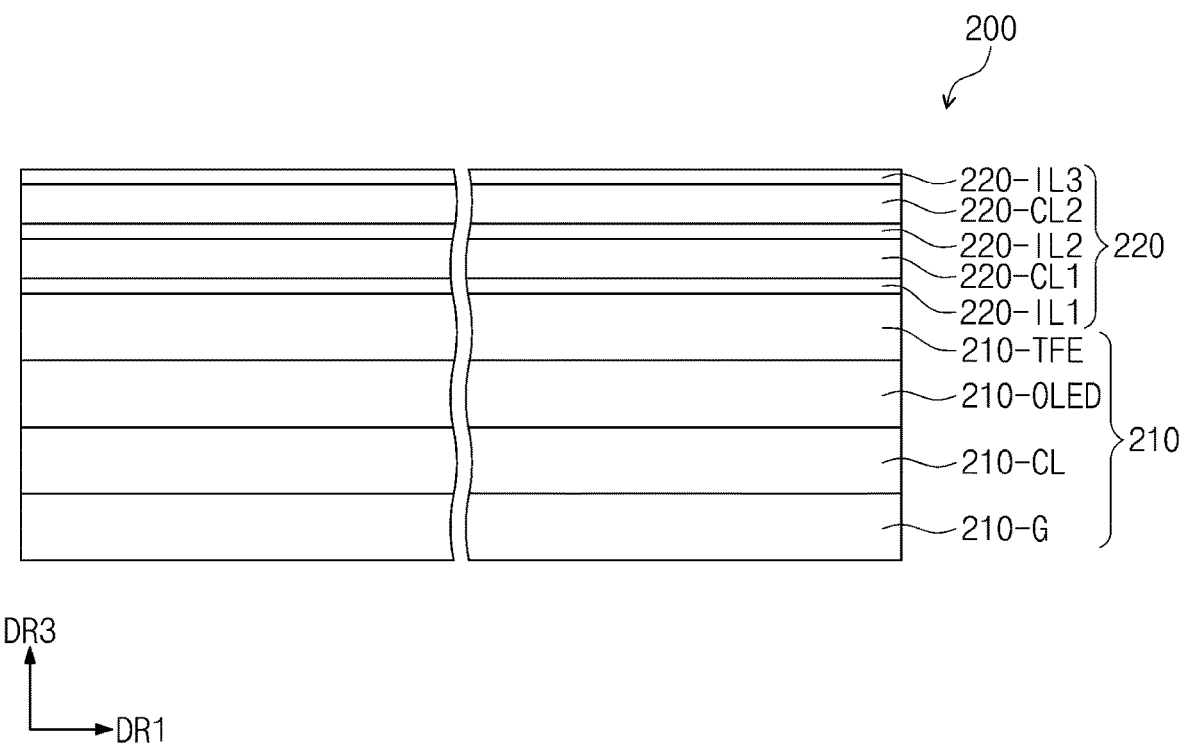
FIG. 2E is a sectional view of an electronic panel according to an embodiment of the present disclosure.

Referring to FIG. 2E, in an embodiment, the input sensor 220 illustrated in FIG. 1C is disposed on the thin film encapsulation layer 210-TFE. The input sensor 220 is formed on the thin film encapsulation layer 210-TFE through a continuous process. No adhesive layer is disposed between the input sensor 220 and the thin film encapsulation layer 210-TFE.

The thin film encapsulation layer 210-TFE is formed by deposition. Because the encapsulation substrate 210-U is omitted, the sealing member SM illustrated in FIG. 1C is also omitted. The display panel 210 according to an embodiment of the present disclosure further includes an additional insulating layer between the display element layer 210-OLED and the thin film encapsulation layer 210-TFE. For example, the display panel 210 further includes an optical insulating layer that controls a refractive index.

FIG. 2D is an enlarged sectional view of a display panel according to the embodiment of FIG. 2C. FIG. 2E is a sectional view of the electronic panel according to the embodiment of FIG. 2C.

Referring to FIG. 2D, the display panel 210 includes a plurality of insulating layers, a semiconductor pattern, a conductive pattern, a signal line, etc. An insulating layer, a semiconductor layer, and a conductive layer are formed by coating, deposition, etc. Thereafter, the insulating layer, the semiconductor layer, and the conductive layer are selectively subjected to patterning by photolithography. The semiconductor pattern, the conductive pattern, and the signal lines in the circuit element layer 210-CL and the display element layer 210-OLED are formed by the above-described method.

At least one inorganic layer is formed on the upper surface of a base substrate 210-G. The inorganic layer contains at least one of aluminum oxide, titanium oxide, silicon oxide, silicon oxy-nitride, zirconium oxide, or hafnium oxide. The inorganic layer includes multiple layers. The multiple inorganic layers form a barrier layer and/or a buffer layer. In an embodiment, the display panel 210 includes a buffer layer BFL.

The buffer layer BFL improves the bonding force between the base substrate 210-G and the semiconductor pattern. The buffer layer BFL includes silicon oxide layers and silicon nitride layers. The silicon oxide layers and the silicon nitride layers are alternately stacked one above the other.

The semiconductor pattern is disposed on the buffer layer BFL. The semiconductor pattern contains poly-silicon. However, embodiments are not necessarily limited thereto, and in an embodiment, the semiconductor pattern contains amorphous silicon or metal oxide.

FIG. 2D illustrates a portion of the semiconductor pattern, and the semiconductor pattern is disposed in another area of the pixel PX on the plane. The semiconductor pattern is arranged across the pixels PX according to a specific rule. The semiconductor pattern has different electrical properties depending on whether or not the semiconductor pattern is doped. The semiconductor pattern includes a doped area and an undoped area. The doped area is doped with an N-type dopant or a P-type dopant. A P-type transistor includes a doped area doped with a P-type dopant.

The doped area has a higher conductivity than the undoped area and substantially serves as an electrode or a signal line. The undoped area substantially corresponds to an active area or a channel of a transistor. For example, a portion of the semiconductor pattern is an active area of a transistor, another portion is a source or drain of the transistor, and another portion is a connecting electrode or a connecting signal line.

As illustrated in FIG. 2D, in an embodiment, a source S1, an active area A1, and a drain D1 of a first transistor T1 are formed from the semiconductor pattern, and a source S2, an active area A2, and a drain D2 of a second transistor T2 are formed from the semiconductor pattern. The sources S1 and S2 and the drains D1 and D2 extend from the active areas A1 and A2 in opposite directions on the section. FIG. 2D shows a portion of a connecting signal line SCL formed from the semiconductor pattern. The connecting signal line SCL may be connected to the drain D2 of the second transistor T2.

A first insulating layer 10 is disposed on the buffer layer BFL. The first insulating layer 10 commonly overlaps the plurality of pixels PX (refer to FIG. 2B) and covers the semiconductor pattern. The first insulating layer 10 may be an inorganic layer and/or an organic layer and may have a single-layer structure or a multi-layer structure. The first insulating layer 10 contains at least one of aluminum oxide, titanium oxide, silicon oxide, silicon oxy-nitride, zirconium oxide, or hafnium oxide. In an embodiment, the first insulating layer 10 is a single layer of silicon oxide. In addition to the first insulating layer 10, other insulating layers of the circuit element layer 210-CL, which will be described below, may be inorganic layers and/or organic layers and may have a single-layer structure or a multi-layer structure. The inorganic layers contain at least one of the aforementioned materials.

Gates G1 and G2 are disposed on the first insulating layer 10. The gate G1 is a portion of a metal pattern. The gates G1 and G2 overlap the active areas A1 and A2. The gates G1 and G2 serve as masks in a process of doping the semiconductor pattern.

A second insulating layer 20 that covers the gates G1 and G2 is disposed on the first insulating layer 10. The second insulating layer 20 commonly overlaps the pixels PX (refer to FIG. 2B). The second insulating layer 20 may be an inorganic layer and/or an organic layer and may have a single-layer structure or a multi-layer structure. In an embodiment, the second insulating layer 20 is a single layer of silicon oxide.

An upper electrode UE is disposed on the second insulating layer 20. The upper electrode UE overlaps the gate G2 of the second transistor T2. The upper electrode UE is a portion of a metal pattern. A portion of the gate G2 and the upper electrode UE that overlaps the gate G2 form a capacitor. In an embodiment of the present disclosure, the upper electrode UE is omitted.

A third insulating layer 30 that covers the upper electrode UE is disposed on the second insulating layer 20. In an embodiment, the third insulating layer 30 is a single layer of silicon oxide. A first connecting electrode CNE1 is disposed on the third insulating layer 30. The first connecting electrode CNE1 is connected to the connecting signal line SCL through a contact hole CNT-1 that penetrates the first to third insulating layers 10, 20, and 30.

A fourth insulating layer 40 that covers the first connecting electrode CNE1 is disposed on the third insulating layer 30. The fourth insulating layer 40 is a single layer of silicon oxide. A fifth insulating layer 50 is disposed on the fourth insulating layer 40. The fifth insulating layer 50 is an organic layer. A second connecting electrode CNE2 is disposed on the fifth insulating layer 50. The second connecting electrode CNE2 is connected to the first connecting electrode CNE1 through a contact hole CNT-2 that penetrates the fourth insulating layer 40 and the fifth insulating layer 50.

A sixth insulating layer 60 that covers the second connecting electrode CNE2 is disposed on the fifth insulating layer 50. The sixth insulating layer 60 is an organic layer. A first electrode AE, or an anode, is disposed on the sixth insulating layer 60. The first electrode AE is connected to the second connecting electrode CNE2 through a contact hole CNT-3 that penetrates the sixth insulating layer 60. A pixel defining film PDL is disposed on the sixth insulating layer 60 and the first electrode AE. The pixel defining film PDL includes an opening OP that exposes at least a portion of the first electrode AE. The pixel defining film PDL is an organic layer.

As illustrated in FIG. 2D, in an embodiment, a display area includes an emissive area PXA and a non-emissive area NPXA adjacent to the emissive area PXA. The non-emissive area NPXA surrounds the emissive area PXA. In an embodiment, the emissive area PXA corresponds to at least a partial area of the first electrode AE exposed through the opening OP.

A hole control layer HCL is commonly disposed in the emissive area PXA and the non-emissive area NPXA. The hole control layer HCL includes a hole transporting layer and a hole injection layer. An emissive layer EML is disposed on the hole control layer HCL. The emissive layer EML is disposed in an area that corresponds to the opening OP. That is, the emissive layer EML is separately formed for each of the pixels.

An electron control layer ECL is disposed on the emissive layer EML. The electron control layer ECL includes an electron transporting layer and an electron injection layer. The hole control layer HCL and the electron control layer ECL are commonly formed for the plurality of pixels by using an open mask. A second electrode CE, or a cathode, is disposed on the electron control layer ECL. The second electrode CE has an integral shape and is commonly disposed for the plurality of pixels PX (refer to FIG. 2B). As illustrated in FIG. 2D, the thin film encapsulation layer 210-TFE is disposed on the second electrode CE. The hole control layer HCL, the electron control layer ECL, and the emissive layer EML form an organic light emitting diode OLED.

FIG. 2E is a sectional view of the electronic panel 200 according to an embodiment of the present disclosure.

FIG. 2E illustrates a "layer" type input sensor. The input sensor has a multi-layer structure irrespective of whether the input sensor is a "panel" type or a "layer" type. The input sensor includes a sensing electrode, a signal line connected to the sensing electrode, and at least one insulating layer. The input sensor senses an external input, for example, in a capacitive manner.

As illustrated in FIG. 2E, the input sensor 220 includes a first insulating layer 220-ILL or a first sensor insulating layer, a first conductive layer 220-CL1, a second insulating layer 220-IL2, or a second sensor insulating layer, a second conductive layer 220-CL2, and a third insulating layer 220-IL3, or a third sensor insulating layer. The first insulating layer 220-IL1 is disposed directly on the thin film encapsulation layer 210-TFE. In an embodiment of the present disclosure, the first insulating layer 220-IL1 and/or the third insulating layer 220-IL3 are omitted.

The first conductive layer 220-CL1 and the second conductive layer 220-CL2 may have a single-layer structure, or may have a multi-layer structure stacked in the third direction DR3. In an embodiment, a conductive layer that has a multi-layer structure includes at least two transparent conductive layers. In an embodiment, a conductive layer that has a multi-layer structure includes at least two metal layers. In an embodiment, a conductive layer that has a multi-layer structure includes at least one transparent conductive layer and at least one metal layer. The multi-layered conductive layer includes metal layers that contain different metals. The transparent conductive layers contains at least one of indium tin oxide (ITO), indium zinc oxide (IZO), zinc oxide (ZnO), indium tin zinc oxide (ITZO), PEDOT, metal nano-wire, or graphene. The metal layers contain at least one of molybdenum, silver, titanium, copper, aluminum, or an alloy thereof. For example, each of the first conductive layer 220-CL1 and the second conductive layer 220-CL2 has a three-layer metallic structure, such as a three-layer structure of titanium/aluminum/titanium. A metal that is relatively high durable and has a relatively low reflectivity is used as an outer layer, and metal that has a relatively high electrical conductivity is used as an inner layer.

Each of the first conductive layer 220-CL1 and the second conductive layer 220-CL2 includes a plurality of conductive patterns. Hereinafter, for simplicity of description, the first conductive layer 220-CL1 will be described as including first conductive patterns and the second conductive layer 220-CL2 will be described as including second conductive patterns. The first conductive patterns and the second conductive patterns each include sensing electrodes and signals lines connected thereto.

Each of the first insulating layer 220-IL1, the second insulating layer 220-IL2, and the third insulating layer 220-IL3 includes one of an inorganic film or an organic film. In an embodiment, the first insulating layer 220-IL1 and the second insulating layer 220-IL2 are inorganic films. The inorganic films contain at least one of aluminum oxide, titanium oxide, silicon oxide, silicon oxy-nitride, zirconium oxide, or hafnium oxide. The third insulating layer 220-IL3 includes an organic film. The organic film contains at least one of an acrylate-based resin, a methacrylate-based resin, a polyisoprene-based resin, a vinyl-based resin, an epoxy-based resin, a urethane-based resin, a celluose-based resin, a siloxane-based resin, a polyimide-based resin, a polyamide-based resin, or a perylene-based resin.

Figure 3:
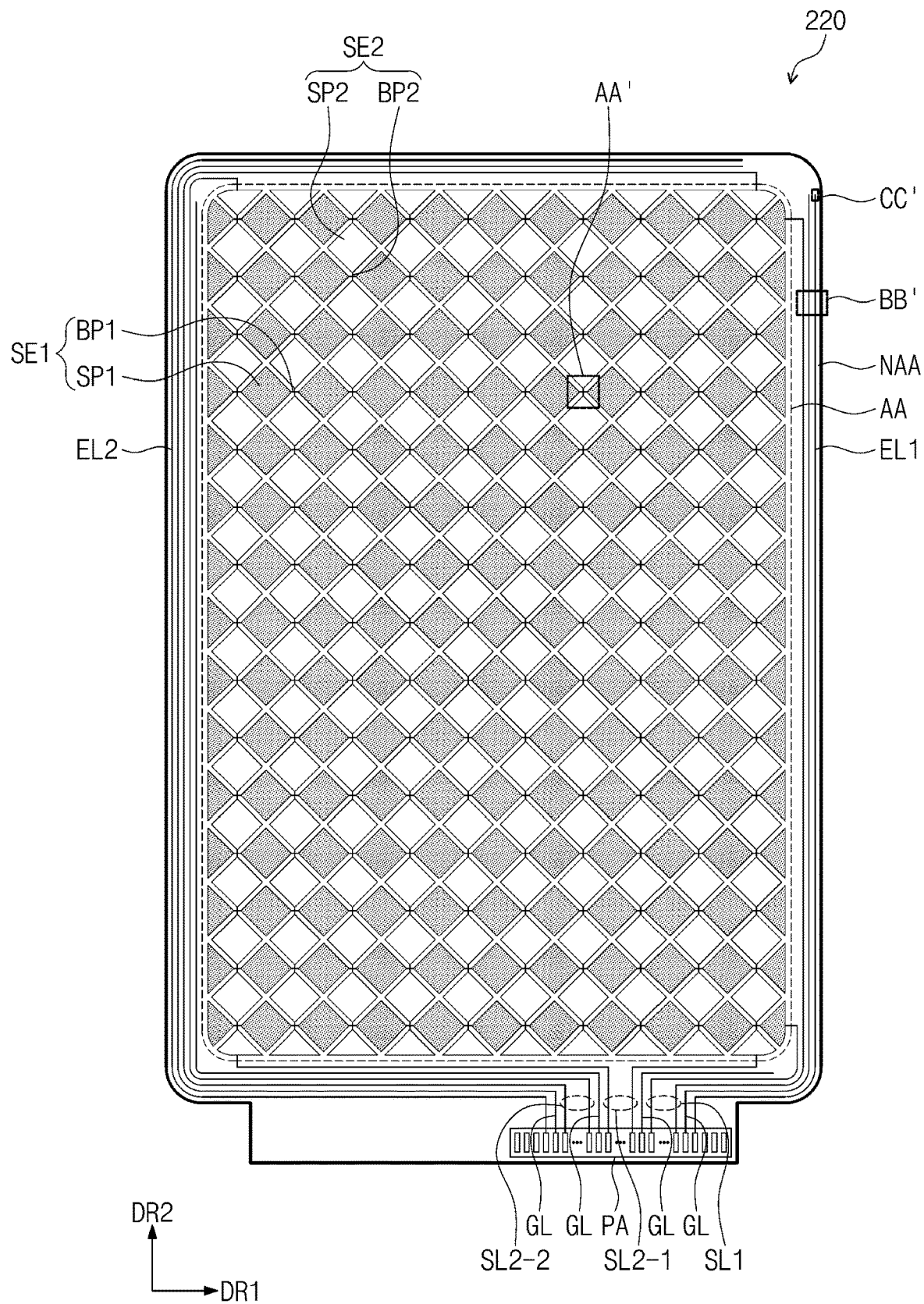
FIG. 3 is a plan view of an input sensor according to an embodiment of the present disclosure.
Figure 4:
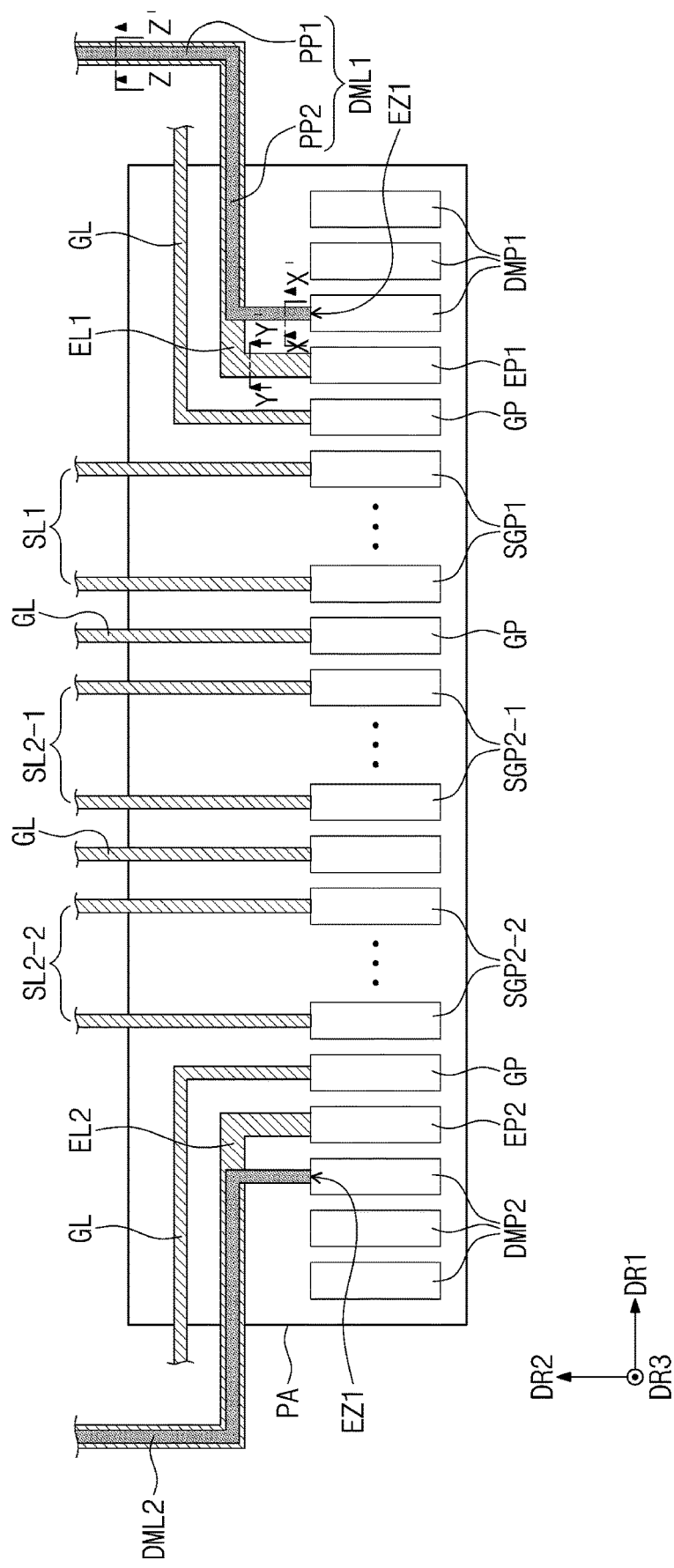
FIG. 4 is an enlarged view of a pad area according to an embodiment of the present disclosure.

FIG. 3 is a plan view of the input sensor 220 according to an embodiment of the present disclosure. FIG. 4 is an enlarged view of a pad area according to an embodiment of the present disclosure.

Referring to FIGS. 3 and 4, in an embodiment, the input sensor 220 includes a plurality of sensing electrodes SE1 and SE2 and a plurality of signal lines SL1, SL2-1, and SL2-2 connected to the plurality of sensing electrodes SE1 and SE2. The input sensor 220 includes ground lines EL1 and EL2, a plurality of guard lines GL, and sensing lines DML1 and DML2. The input sensor 220 includes signal pads SGP1, SGP2-1, and SGP2-2, ground pads EP1 and EP2, guard pads GP, and dummy pads DMP1 and DMP2.

In FIG. 3, the sensing electrodes SE1 and SE2 are disposed in the active area AA. The sensing electrodes SE1 and SE2 include the plurality of first sensing electrodes SE1 and the plurality of second sensing electrodes SE2 that cross each other. The first sensing electrodes SE1 extend in the first direction DR1 and are arranged in the second direction DR2. Each of the first sensing electrodes SE1 includes a plurality of first sensing portions SP1 and a plurality of first intermediate portions BP1 arranged in the first direction DR1.

The second sensing electrodes SE2 extend in the second direction DR2 and are arranged in the first direction DR1. Each of the second sensing electrodes SE2 includes a plurality of second sensing portions SP2 and a plurality of second intermediate portions BP2 arranged in the second direction DR2.

The signal lines SL1, SL2-1, and SL2-2, the ground lines EL1 and EL2, the plurality of guard lines GL, and the sensing lines DML1 and DML2 are disposed in the peripheral area NAA.

The signal lines SL1, SL2-1, and SL2-2 include the plurality of first signal lines SL1 and the plurality of second signal lines SL2-1 and SL2-2.

Each of the first signal lines SL1 is connected to one end of a corresponding first sensing electrode SE1. Each of the second signal lines SL2-1 is connected to one end of a corresponding second sensing electrode SE2. Each of the other second signal lines SL2-2 is connected to an opposite end of a corresponding second sensing electrode SE2. That is, FIG. 3 shows the first signal lines SL1 of the input sensor 220 as having a single routing structure, and the second signal lines SL2-1 and SL2-2 as having a double routing structure. However, embodiments are not necessarily limited thereto. For example, in an embodiment, the first signal lines SL1 have a double routing structure, and the second signal lines SL2-1 and SL2-2 have a single routing structure.

The first signal lines SL1 and the second signal lines SL2-1 and SL2-2 are respectively connected with the signal pads SGP1, SGP2-1, and SGP2-2. The signal pads SGP1, SGP2-1, and SGP2-2 are arranged in the first direction DR1 in the pad area PA. That is, the area where the signal pads SGP1, SGP2-1, and SGP2-2 are arranged in the peripheral area NAA in which the first signal lines SL1 and the second signal lines SL2-1 and SL2-2 are disposed is separately defined as the pad area PA. For example, in the peripheral area NAA, the pad area PA is below the active area AA in the second direction DR2.

The ground lines EL1 and EL2 include the first ground line EL1 and the second ground line EL2. The ground lines EL1 and EL2 are in an electrically grounded state. In the peripheral area NAA, the ground lines EL1 and EL2 are disposed furthest from the active area AA. For example, the ground lines EL1 and EL2 are disposed at outermost positions in the peripheral area NAA. In an embodiment, the ground lines EL1 and EL2 correspond to ESD ring lines. The ESD ring lines block an external electro static discharge (ESD) source.

In an embodiment, the first ground line EL1 and the second ground line EL2 are spaced apart from each other with respect to the active area AA. For example, the first ground line EL1 is disposed at the outermost position of the peripheral area NAA in the first direction DR1 on one side of the active area AA, and the second ground line EL2 is disposed at the outermost position of the peripheral area NAA on the other side of the active area AA that faces the one side of the active area AA. For example, the first ground line EL1 is adjacent to the first signal lines SL1, and the second ground line EL2 is adjacent to the second signal lines SL2-2.

Each of the plurality of guard lines GL are disposed between adjacent lines to prevent coupling that unintentionally occurs between the adjacent lines. The guard lines GL are disposed between the plurality of adjacent signal lines SL1, SL2-1, and SL2-2.

In an embodiment, the guard lines GL are disposed between the signal lines SL1, SL2-1, and SL2-2 and the ground lines EL1 and EL2.

The guard lines GL may have a ground voltage, or may have the same voltage as the sensing electrodes, depending on a driving method of the input sensor 220. For example, when the driving method of the input sensor 220 is a self-cap driving method, the guard lines GL have the same voltage as the sensing electrodes, and when the driving method of the input sensor 220 is a mutual-cap driving method, the guard lines GL have a ground voltage. The self-cap driving method senses an external input by detecting a change in capacitance between an external input device and the sensing electrodes, and the mutual-cap driving method senses an external input by detecting a change in capacitance between the sensing electrodes, depending on an external input device.

The input sensor 220 further includes the sensing lines DML1 and DML2. The sensing lines DML1 and DML2 are patterned together with the sensing electrodes SE1 and SE2 and contain the same material as the sensing electrodes SE1 and SE2. For example, the sensing lines DML1 and DML2 contain a transparent conductive oxide (TCO) such as at least one of indium tin oxide (ITO), indium zinc oxide (IZO), zinc oxide (ZnO), indium tin zinc oxide (ITZO), PEDOT, metal nano-wire, or graphene. The sensing lines DML1 and DML2 overlap the ground lines EL1 and EL2 in the thickness direction of the input sensor 220. A detailed description will be given below with reference to FIGS. 4 and 6A to 8C.

In FIG. 4, the signal pads SGP1, SGP2-1, and SGP2-2, the guard pads GP, the ground pads EP1 and EP2, and the dummy pads DMP1 and DMP2 are disposed in the pad area PA. The circuit board FCB (refer to FIG. 1B) is mounted on the pad area PA.

The ground lines EL1 and EL2 are connected with the ground pads EP1 and EP2. The guard lines GL are connected with the guard pads GP. The sensing lines DML1 and DML2 are connected with the dummy pads DMP1 and DMP2. The sensing lines DML1 and DML2 include the first sensing line DML1 and the second sensing line DML2. One end EZ1 of the first sensing line DML1 is electrically connected with one of the first dummy pads DMP1, and one end EZ1 of the second sensing line DML2 is electrically connected with one of the second dummy pads DMP2. An opposite end of the first sensing line DML1 and an opposite end of the second sensing line DML2 is disposed on the peripheral area NAA.

The plurality of first signal lines SL1 are connected with the plurality of first signal pads SGP1. The plurality of second signal lines SL2-1 and SL2-2 are connected with the plurality of second signal pads SGP2-1 and SGP2-2. The plurality of first and second signal pads SGP1, SGP2-1, and SGP2-2 are located in the middle of the pad area PA. The first ground pad EP1 and the second ground pad EP2 are disposed on opposite sides of the plurality of first and second signal pads SGP1, SGP2-1, and SGP2-2. The first dummy pads DMP1 and the second dummy pads DMP2 are spaced apart from each other in the first direction DR1. The first dummy pads DMP1 are disposed next to the first ground pad EP1. The second dummy pads DMP2 are disposed next to the second ground pad EP2. The first ground pad EP1 and the second ground pad EP2 are located between the first dummy pads DMP1 and the second dummy pads DMP2.

In an embodiment, the first sensing line DML1 is electrically connected to the first dummy pad DMP1 closest to the first ground pad EP1. The second sensing line DML2 is electrically connected to the second dummy pad DMP2 closest to the second ground pad EP2. The plurality of first dummy pads DMP1 are electrically connected together through a metal electrode. The plurality of second dummy pads DMP2 are electrically connected together through a metal electrode. The plurality of first dummy pads DMP1 and the plurality of second dummy pads DMP2 are disposed at the outermost positions in the pad area PA and perform various roles. For example, the plurality of first and second dummy pads DMP1 and DMP2 correspond to pads that manage press resistance when the circuit board FCB is pressed against and coupled with the input sensor 220 in the pad area PA. Measuring equipment that detects a wiring defect can be connected to the plurality of first and second dummy pads DMP1 and DMP2. In an embodiment, the measuring equipment connected to the first and second dummy pads DMP1 and DMP2 detects whether the first and second sensing lines DML1 and DML2 are damaged.

Each of the first sensing line DML1 and the second sensing line DML2 includes a first portion PP1 and a second portion PP2. The first portions PP1 are disposed in the peripheral area NAA, and the second portions PP2 are disposed in the pad area PA. For example, in the peripheral area NAA, the first portions PP1 are disposed outside the pad area PA. The first portions PP1 overlap the ground lines EL1 and EL2 in the third direction DR3. The first portion PP1 of the first sensing line DML1 overlaps the first ground line EL1, and the first portion PP1 of the second sensing line DML2 overlaps the second ground line EL2. Parts of the second portions PP2 do not overlap the ground lines EL1 and EL2. For example, the second portions PP2 are spaced apart from the ground lines EL1 and EL2 on the plane. Detailed description will be given below with reference to FIGS. 6A to 8C.

Figure 5A:
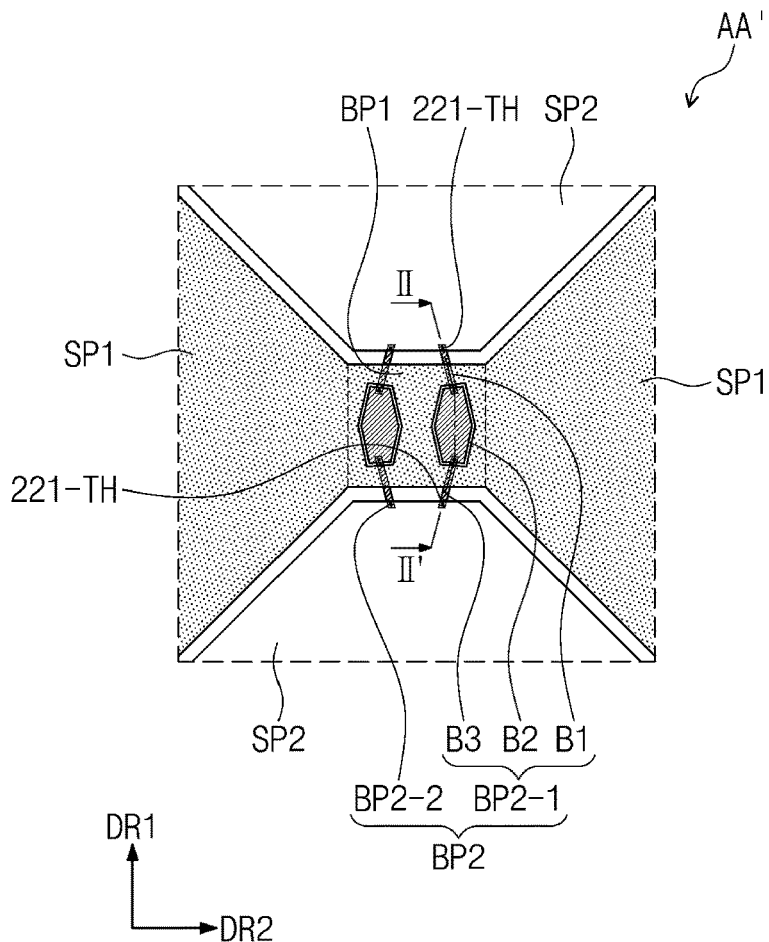
FIG. 5A is an enlarged view of area AA' of FIG. 3.
Figure 5B:
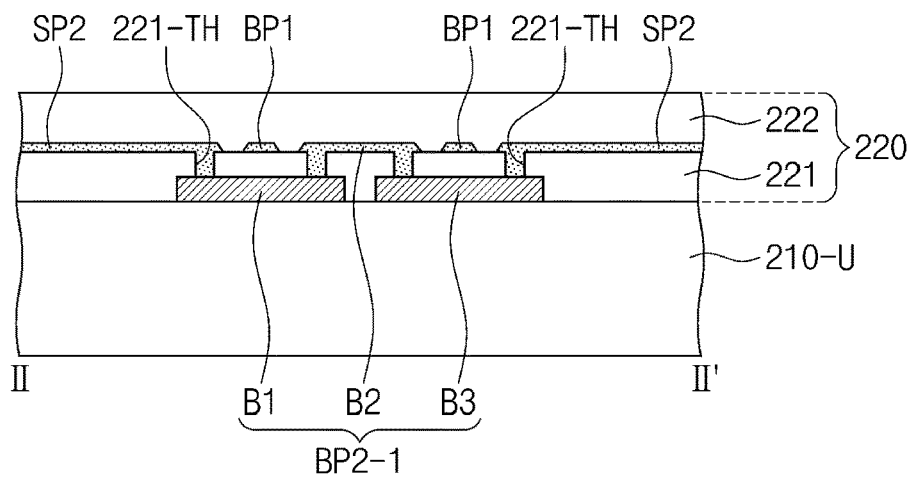
FIG. 5B is a sectional view taken along line II-IF of FIG. 5A.

FIG. 5A is a plan view of a first area AA' of FIG. 3. FIG. 5B is a sectional view taken along line II-IF of FIG. 5A. Hereinafter, the sensing electrodes SE1 and SE2 of the input sensor 220 will be described in detail with reference to FIGS. 3, 5A, and 5B.

As illustrated in FIGS. 5A and 5B, in an embodiment, the first area AA' corresponds to an intersection area of the first sensing electrode SE1 and the second sensing electrode SE2. The first intermediate portion BP1 and the second intermediate portions BP2 are disposed in the intersection area. In an embodiment, the first sensing portions SP1 and the first intermediate portion BP1 have an integral shape. However, embodiments of the present disclosure are not necessarily limited thereto. In an embodiment of the present disclosure, the second sensing portions SP2 and the second intermediate portions BP2 have an integral shape.

The second sensing portions SP2 and the second intermediate portions BP2 of the second sensing electrode SE2 are referred to as electrode patterns and bridge patterns, respectively. For example, in an embodiment, the second sensing electrode SE2 includes the electrode patterns SP2 and the bridge patterns BP2. Although FIG. 5A shows a first bridge pattern BP2-1 and a second bridge pattern BP2-2 disposed in one intersection area, the number of bridge patterns BP2 is not particularly limited.

In an embodiment, each of the first bridge pattern BP2-1 and the second bridge pattern BP2-2 includes a first portion B1, a second portion B2, and a third portion B3. The second portion B2 is disposed on a different layer from the first portion B1 and the third portion B3. The second portion B2 is disposed on the same layer as the electrode patterns SP2. Although FIGS. 5A and 5B show the first bridge pattern BP2-1 and the second bridge pattern BP2-2 as each including the plurality of portions B1, B2, and B3, embodiments of the present disclosure are not necessarily limited thereto. In an embodiment of the present disclosure, each of the first bridge pattern BP2-1 and the second bridge pattern BP2-2 is implemented with one pattern disposed on the same layer as the first portion B1, and the one pattern connects the two second sensing portions SP2 spaced apart from each other. The one pattern does not overlap the first intermediate portion BP1 but overlaps the first sensing portion SP1.

As illustrated in FIGS. 5A and 5B, in an embodiment, the input sensor 220 is disposed directly on the encapsulation substrate 210-U. Although the encapsulation substrate 210-U in an embodiment includes only the base substrate, or the second base substrate, embodiments of the present disclosure are not necessarily limited thereto. Although parts of the bridge patterns BP2 in an embodiment are illustrated as making contact with the upper surface of the encapsulation substrate 210-U, embodiments of the present disclosure are not necessarily limited thereto. In an embodiment of the present disclosure, a buffer layer is additionally disposed on the upper surface of the encapsulation substrate 210-U, and parts of the bridge patterns BP2 make contact with the upper surface of the buffer layer. The buffer layer includes an inorganic layer and/or an organic layer. In an embodiment of the present disclosure, the input sensor 220 is not disposed directly on the encapsulation substrate 210-U. In an embodiment, the input sensor 220 further includes a base substrate, and the base substrate of the input sensor 220 is coupled to the encapsulation substrate 210-U through an adhesive layer.

At least parts of the bridge patterns BP2 are disposed on the upper surface of the encapsulation substrate 210-U. The first portions B1 and the third portions B3 are disposed on the upper surface of the encapsulation substrate 210-U. The first portions B1 and the third portions B3 contain metal. The first portions B1 and the third portions B3 contain at least one of titanium (Ti), aluminum (Al), copper (Cu), gold (Au), or silver (Ag). The first portions B1 and the third portions B3 have multi-layer structures that includes a metal layer formed of the metal. In an embodiment, each of the first portions B1 and the third portions B3 has a three-layer structure of titanium/aluminum/titanium.

A first insulating layer 221 is disposed on the upper surface of the encapsulation substrate 210-U. The first sensing electrode SE1, the electrode patterns SP2, and the second portions B2 are disposed on the first insulating layer 221. The first intermediate portion BP1 has an opening formed therein in which the second portions B2 are disposed. The electrode patterns SP2 and the second portions B2 are connected to the bridge patterns BP2 through through-holes 221-TH that penetrate the first insulating layer 221.

The first sensing electrode SE1, the electrode patterns SP2, and the second portions B2 contain the same material. The first sensing electrode SE1, the electrode patterns SP2, and the second portions B2 contain a transparent conductive oxide (TCO). The first sensing electrode SE1, the electrode patterns SP2, and the second portions B2 may contain at least one of PEDOT, metal nano-wire, or graphene, in addition to a TCO such as one of indium tin oxide (ITO), indium zinc oxide (IZO), zinc oxide (ZnO), or indium tin zinc oxide (ITZO).

A second insulating layer 222 is disposed on the first insulating layer 221. The second insulating layer 222 covers the first sensing electrode SE1, the electrode patterns SP2, and the second portions B2. The first insulating layer 221 and the second insulating layer 222 contain an inorganic material or an organic material.

Figure 5C:
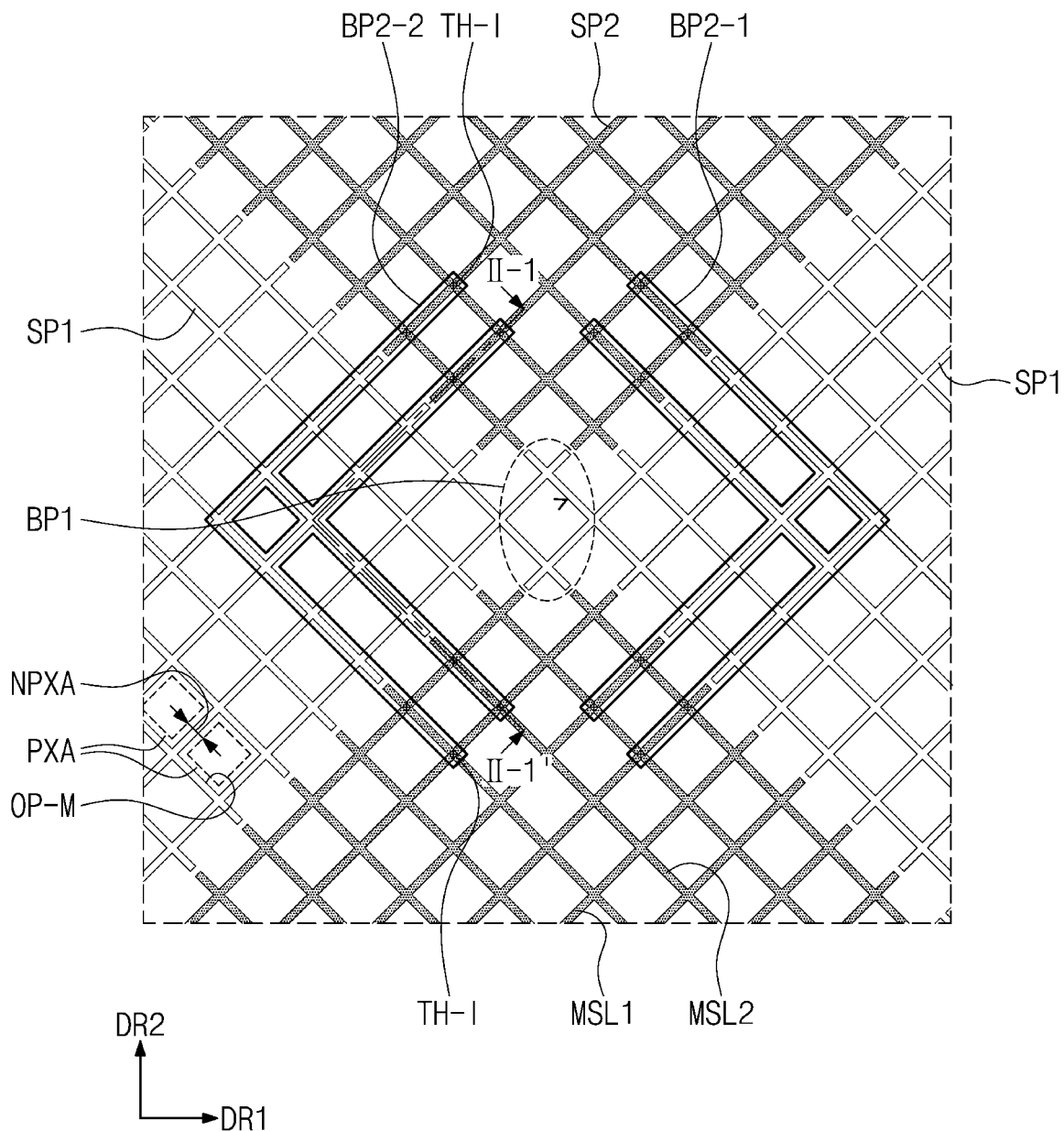
FIG. 5C is a partial plan view of an input sensor according to an embodiment of the present disclosure.
Figure 5D:
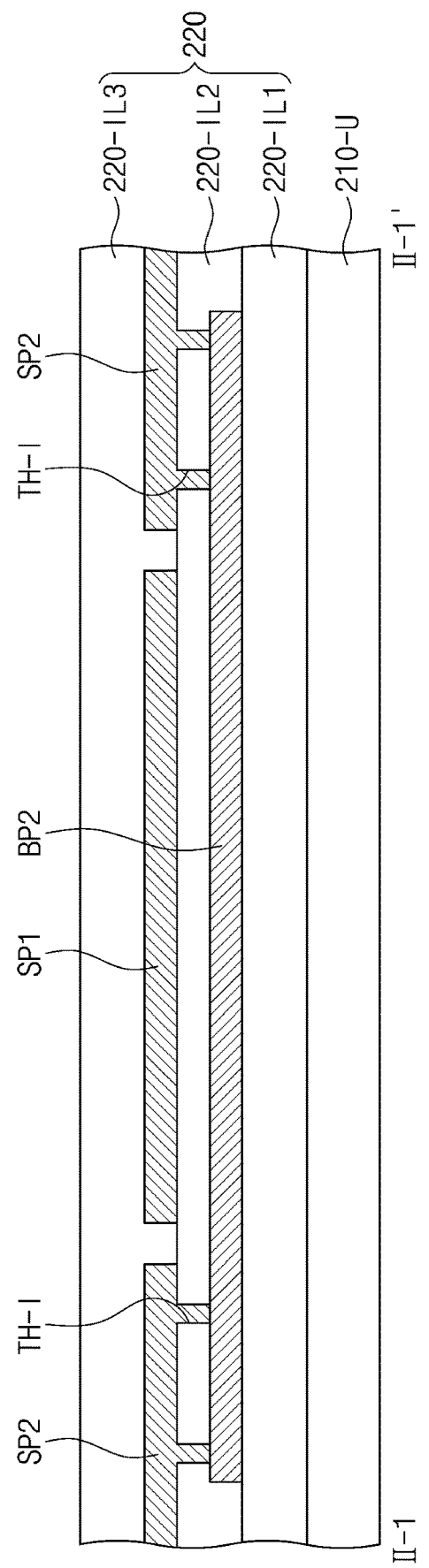
FIG. 5D is a sectional view taken along line II-1-II-1' of FIG. 5C.

FIGS. 5C and 5D illustrate one intersection area. FIG. 2E is referred to in relation to the stacked structure of FIG. 5D. The first sensing portions SP1, the first intermediate portion BP1, and the second sensing portions SP2 have a mesh shape. The first sensing portions SP1, the first intermediate portion BP1, and the second sensing portions SP2 include conductive lines MSL1 and MSL2. The conductive lines MSL1 and MSL2 extend in directions that cross the first direction DR1 and the second direction DR2 and extend in different directions. The conductive lines MSL1 and MSL2 define a plurality of openings OP-M. An emissive area PXA is formed in each of the openings OP-M. The conductive lines MSL1 and MSL2 overlap a non-emissive area NPXA.

As illustrated in FIG. 5C, in an embodiment, the second intermediate portions BP2 overlap the first sensing portions SP1. As illustrated in FIG. 5D, the second intermediate portions BP2 connect the second sensing portions SP2 through contact holes TH-I that penetrate the second insulating layer 220-IL2.

Figure 6A:
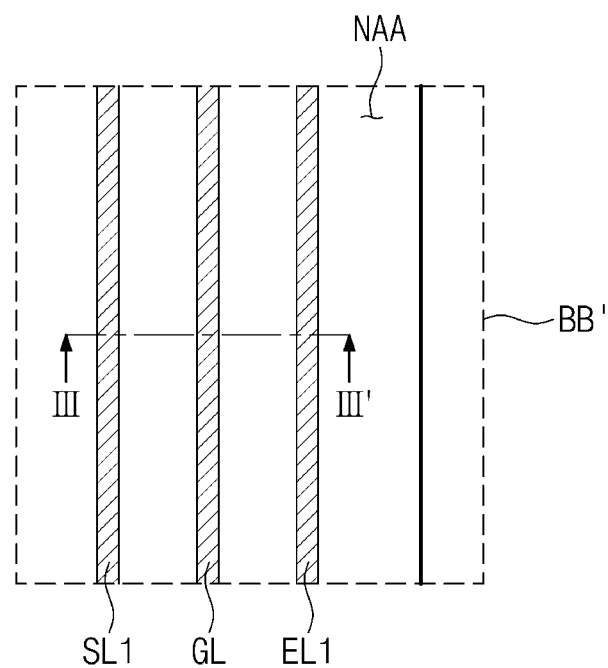
FIG. 6A is an enlarged view of area BB' of FIG. 3.
Figure 6B:
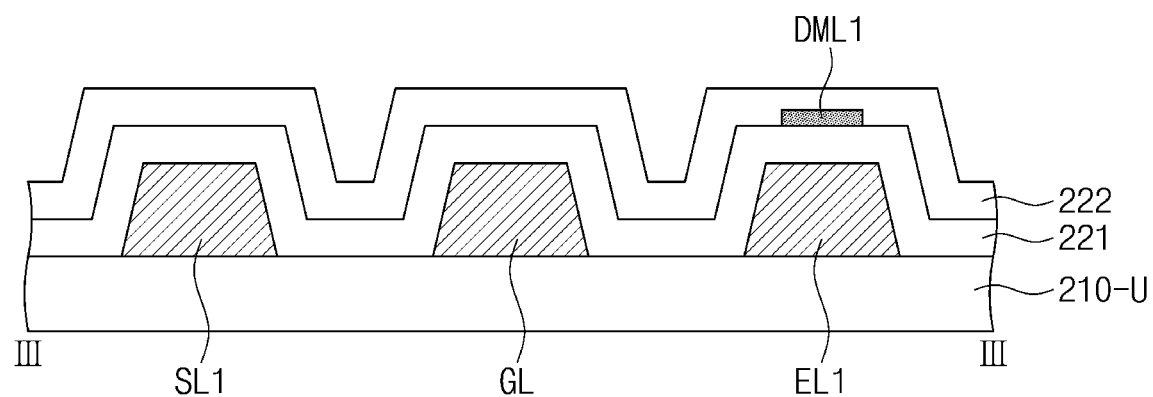
FIG. 6B is a sectional view taken along line of FIG. 6A.

FIG. 6A is an enlarged view of area BB' of FIG. 3. FIG. 6B is a sectional view taken along line III-III' of FIG. 6A. Hereinafter, FIGS. 6A and 6B will be described with reference to FIG. 4.

According to an embodiment, FIG. 6A illustrates an intermediate line portion that connects opposite end portions of the first ground line EL1 Although only the first ground line EL1 is illustrated in FIG. 6A, the same description applies to the second ground line EL2 on the opposite side of the first ground line EL1. In FIG. 6A, the first ground line EL1 is disposed at the outermost position of the peripheral area NAA. For example, the first signal line SL1, the guard line GL, and the first ground line EL1 are sequentially arranged in the direction away from the active area AA (refer to FIG. 3).

In FIG. 6B, in an embodiment, the first sensing line DML1 is disposed over the first ground line EL1 in the third direction DR3. The first sensing line DML1 overlaps the first ground line EL1 in the third direction DR3.

More specifically, the first signal line SL1, the guard line GL, and the first ground line EL1 are disposed on the base substrate 210-U. The base substrate 210-U is the encapsulation substrate 210-U (refer to FIG. 1C) of the display panel 210. In an embodiment, the base substrate 210-U is the thin film encapsulation layer 210-TFE (refer to FIG. 2E). The first signal line SL1, the guard line GL, and the first ground line EL1 are disposed directly on the encapsulation substrate 210-U or the thin film encapsulation layer 210-TFE, depending on the structure of the display panel 210.

The first insulating layer 221 is disposed on the base substrate 210-U. The second insulating layer 222 is disposed on the first insulating layer 221. The first sensing line DML1 is disposed on the first insulating layer 221.

In FIG. 6B, in an embodiment, the first sensing line DML1 does not make contact with the first ground line EL1 An intermediate line portion of the first sensing line DML1 that overlaps the intermediate line portion of the first ground line EL1 corresponds to the first portion PP1 (refer to FIG. 4) of the first sensing line DML1. In an embodiment, the first sensing line DML1 does not make contact with the first ground line EL1 over the line portion that connects opposite end portions of the first sensing line DML1, and therefore the first sensing line DML1 and the first ground line EL1 are not electrically connected with each other. FIG. 6B illustrates the first sensing line DML1 as overlapping the first ground line EL1, and the same description applies to the second sensing line DML2 (refer to FIG. 4) that overlaps the second ground line EL2.

Figure 7A:
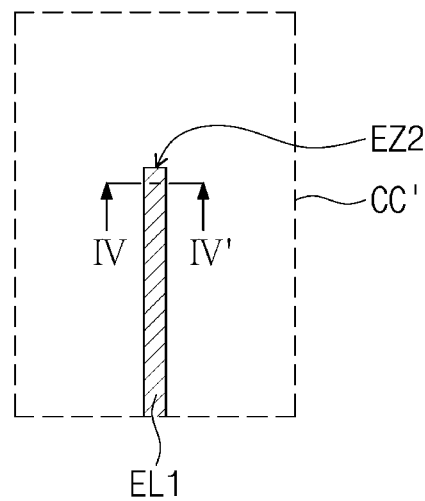
FIG. 7A is an enlarged view of area CC' of FIG. 4.
Figure 7B:
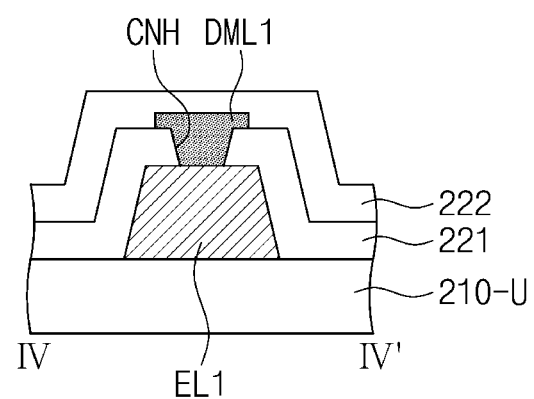
FIG. 7B is a sectional view taken along line IV-IV' of FIG. 7A.

FIG. 7A is an enlarged view illustrating area CC' of FIG. 4. FIG. 7B is a sectional view taken along line IV-IV' of FIG. 7A. FIG. 7A illustrates one end of the first ground line EL1

In FIG. 7A, in an embodiment, the opposite end EZ2 of the first sensing line DML1 is disposed on the one end of the first ground line EL1 and overlaps the one end of the first ground line EL1.

In FIG. 7B, the opposite end EZ2 of the first sensing line DML1 is electrically connected with the first ground line EL1 by making contact with the first ground line EL1 through a contact hole CNH that penetrates the first insulating layer 221. As a result, the first sensing pad DMP1 to which the first sensing line DML1 is connected is electrically connected with the first ground pad EP1 to which the first ground line EL1 is connected.

Figure 8A:
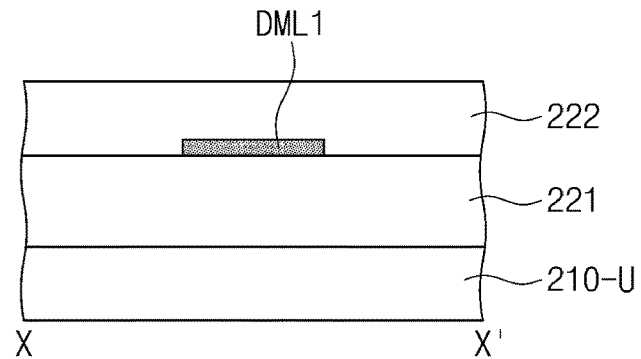
FIG. 8A is a sectional view taken along line X-X' of FIG. 4.
Figure 8B:
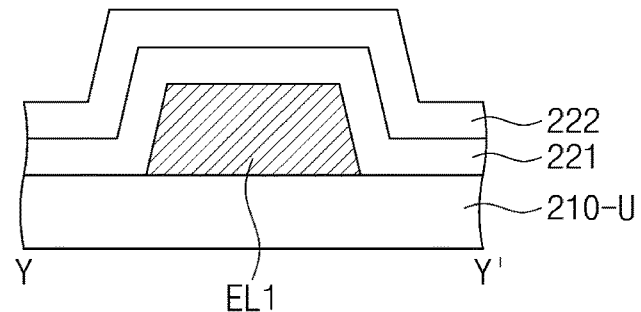
FIG. 8B is a sectional view taken along line Y-Y' of FIG. 4.
Figure 8C:
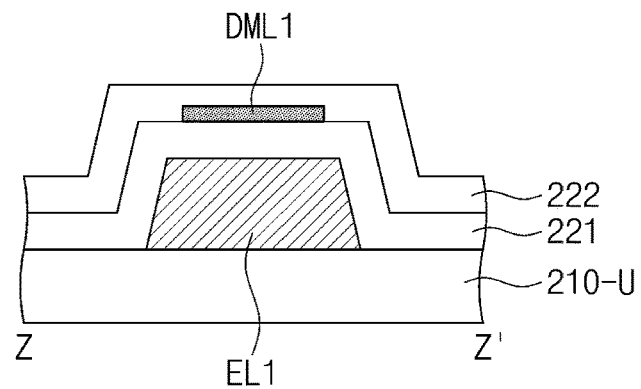
FIG. 8C is a sectional view taken along line Z-Z' of FIG. 4.

FIG. 8A is a sectional view taken along line X-X' of FIG. 4. FIG. 8B is a sectional view taken along line Y-Y' of FIG. 4. FIG. 8C is a sectional view taken along line Z-Z' of FIG. 4. Descriptions will be given with reference to FIG. 4.

FIGS. 8A to 8C illustrate an overlapping relationship between the first ground line EL1 and the first sensing line DML1 in the section. FIGS. 8A to 8C illustrate sectional views of the first sensing line DML1 and the first ground line EL1 disposed in the pad area PA.

In FIG. 8A, in an embodiment, the first sensing line DML1 is disposed on the first insulating layer 221. In FIG. 8A, the first sensing line DML1 is electrically connected at the one end EZ1 with the first dummy pad DMP1. In FIG. 8B, in an embodiment, the first ground line EL1 is disposed on the base substrate 210-U. In FIG. 8B, the first ground line EL1 is electrically connected with the first ground pad EP1. In FIGS. 8A and 8B, the first sensing line DML1 and the first ground line EL1 do not overlap each other.

In FIG. 8C, in an embodiment, the first sensing line DML1 overlaps the first ground line EL1 in the third direction DR3. The first sensing line DML1 and the first ground line EL1 of FIG. 8C overlap each other without electrical connection at the intermediate line portions but are electrically connected with each other at the distal end portion located at the opposite end EZ2 of the first sensing line DML1 of FIG. 7A. Accordingly, the first dummy pad DMP1 and the first ground pad EP1 spaced apart from each other are electrically connected. In an embodiment, an open state at the line portions (refer to FIGS. 6A and 6B) of the sensing lines DML1 and DML2 can be detected through the dummy pads DMP1 and DMP2. The ground lines EL1 and EL2 do not make contact with the sensing lines DML1 and DML2 over the line portions, and therefore a short circuit failure does not occur.

Figure 9A:
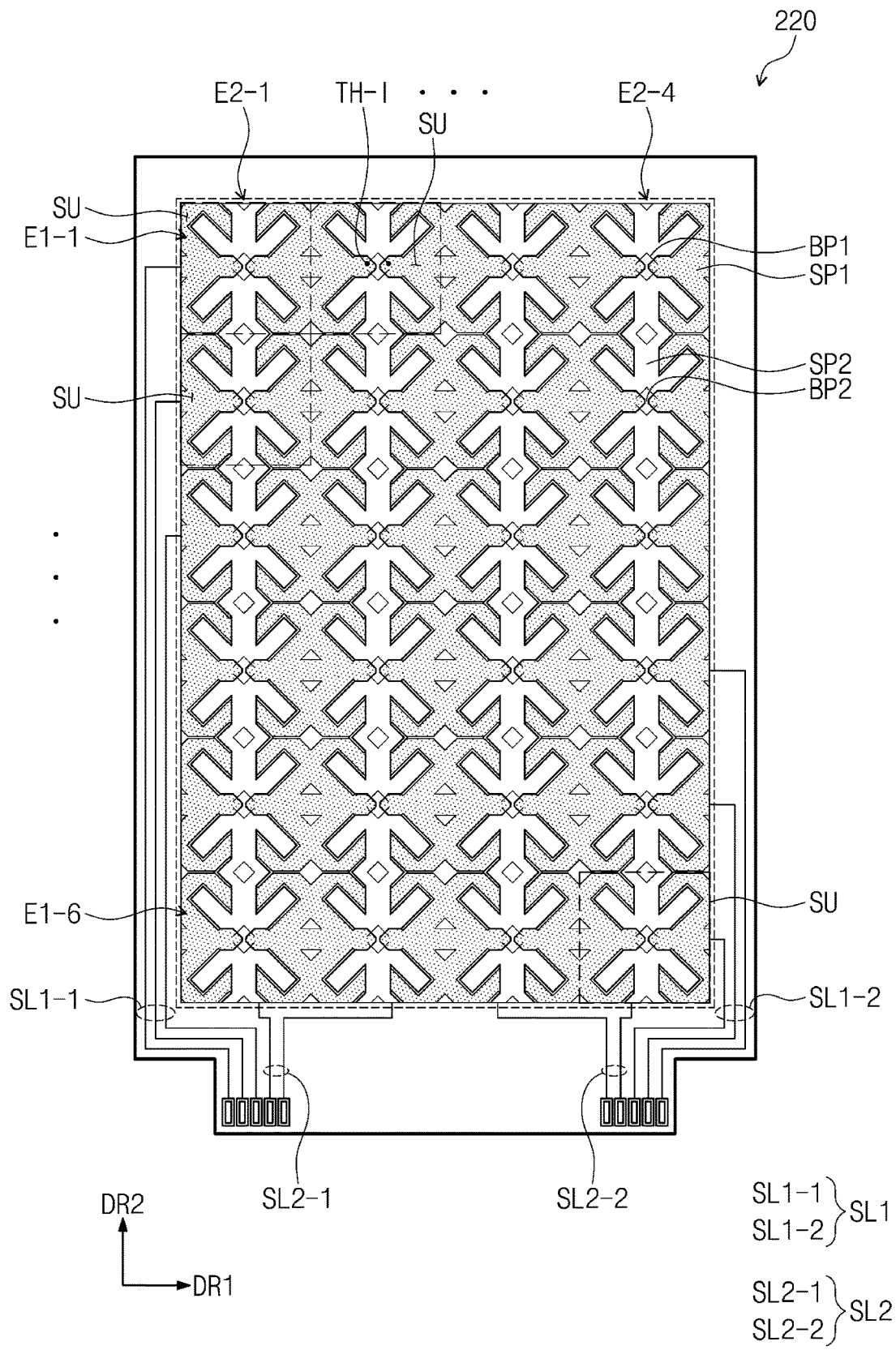
FIG. 9A is a plan view of an input sensor according to an embodiment of the present disclosure.
Figure 9B:
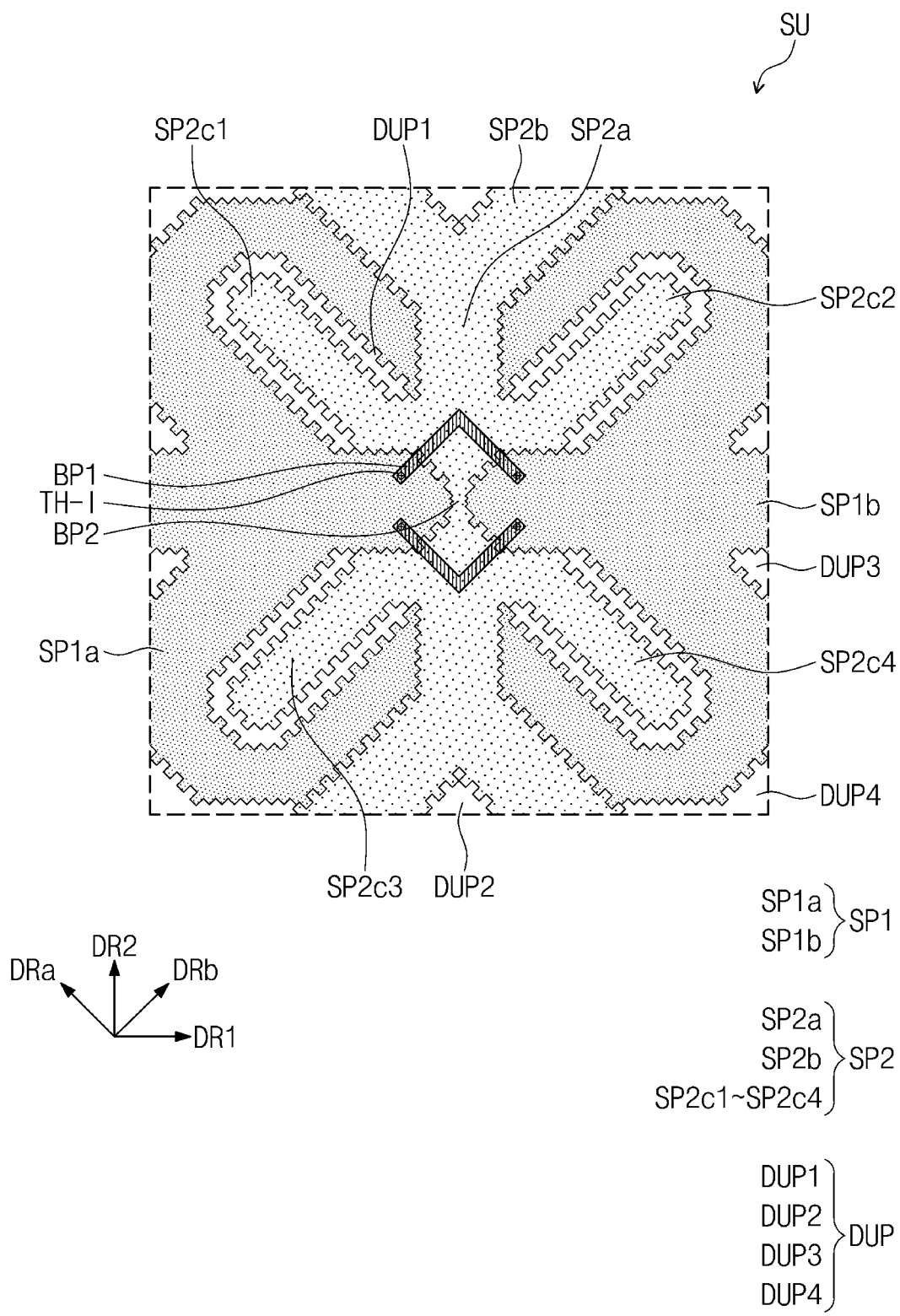
FIG. 9B is an enlarged plan view of a sensing unit illustrated in FIG. 9A.

FIG. 9A is a plan view of an input sensor 220 according to an embodiment of the present disclosure. FIG. 9B is an enlarged plan view of a sensing unit SU illustrated in FIG. 9A.

The following description will focus on differences between the input sensor 220 according to an embodiment of FIGS. 9A and 9B and the input sensor 220 illustrated in FIGS. 3 and 5A to 5D. The input sensor 220 illustrated in FIG. 9A differs from the input sensor 220 illustrated in FIGS. 5A to 5D in terms of the configuration to be described below.

According to an embodiment, FIG. 9A illustrates six first sensing electrodes E1-1 to E1-6, and first signal lines SL1 include a first group of first signal lines SL1-1 and a second group of first signal lines SL1-2. Some of the first sensing electrodes E1-1 to E1-6 are each connected, at one side thereof, with a corresponding first signal line of the first group of first signal lines SL1-1. The other first sensing electrodes are each connected, at an opposite side thereof, with a corresponding first signal line of the second group of first signal lines SL1-2. FIG. 9A illustrates four second sensing electrodes E2-1 to E2-4, and second signal lines SL2 include a first group of second signal lines SL2-1 and a second group of second signal lines SL2-2. Some of the second sensing electrodes E2-1 to E2-4 are each connected, at one side thereof, with a corresponding second signal line of the first group of second signal lines SL2-1. The other second sensing electrodes are each connected, at one side thereof, with a corresponding second signal line of the second group of second signal lines SL2-2. The first group of first signal lines SL1-1 and the first group of second signal lines SL2-1 are aligned, and the second group of first signal lines SL1-2 and the second group of second signal lines SL2-2 are aligned.

According to an embodiment, each of the first sensing electrodes E1-1 to E1-6 includes first sensing portions SP1 and first intermediate portions BP1 that have a bridge pattern. Each of the second sensing electrodes E2-1 to E2-4 includes second sensing portions SP2 and second intermediate portions BP2 that are integrated with each other. The first sensing electrodes E1-1 to E1-6 and the second sensing electrodes E2-1 to E2-4 each have a mesh shape. For example, the first sensing electrodes E1-1 to E1-6 and the second sensing electrodes E2-1 to E2-4 each include a plurality of conductive lines that cross each other to form a mesh.

Referring to FIG. 9B, in an embodiment, each of sensing units SU includes a half of one first sensing portion SP1 and a half of another first sensing portion SP1 disposed on opposite sides of a first intermediate portion BP1, and a half of one second sensing portion SP2 and a half of another second sensing portion SP2 disposed on opposite sides of a second intermediate portion BP2.

Each of the second sensing portions SP2 includes extending portions SP2a and SP2b and branch portions SP2c 1 to SP2c4. The extending portions SP2a and SP2b include the first extending portions SP2a that extends in the second direction DR2 and the second extending portions SP2b that extend from the first extending portions SP2a in a first crossing direction Dra and in a second crossing direction DRb with a second dummy pattern DUP2 therebetween. However, embodiments are not necessarily limited thereto, and in an embodiment, the second dummy pattern DUP2 is not disposed between the second extending portions SP2b, and the second extending portions SP2b extend parallel to the first extending portions SP2a.

The first crossing direction DRa is a direction that crosses the first direction DR1 and the second direction DR2. The second crossing direction DRb crosses the first crossing direction DRa at a right angle while crossing the first direction DR1 and the second direction DR2. Each of the first crossing direction DRa and the second crossing direction DRb corresponds to a diagonal direction between the first direction DR1 and the second direction DR2 on the plane defined by the first direction DR1 and the second direction DR2.

The branch portions SP2c1 to SP2c4 extend in directions away from the second intermediate portion BP2 with the second intermediate portion BP2 therebetween. The branch portions SP2c1 to SP2c4 include the first to fourth branch portions SP2c1 to SP2c4. The first branch portion SP2c1 and the fourth branch portion SP2c4 extend in the first crossing direction DRa, and the second branch portion SP2c2 and the third branch portion SP2c3 extend in the second crossing direction DRb.

The second intermediate portion BP2 is disposed between parts of the first sensing portions SP1 that protrude toward each other in the first direction DR1. The second intermediate portion BP2 connects the first extending portions SP2a of the second sensing portions SP2. The second intermediate portion BP2 is integrally formed on the same layer as the first extending portions SP2a.

Each of the first sensing portions SP1 includes first portions SP1b that extend in the first direction DR1 and second portions SP1a that extend from the first portions SP1b and surround parts of the second sensing portions SP2. The second portions SP1a of the first sensing portion SP1 surround the branch portions SP2c1 to SP2c4 of the second sensing portions SP2, respectively, which are disposed adjacent to the first sensing portion SP1. Referring to FIG. 9B, the second portions SP1a of the first sensing portion SP1 disposed on the left side of the sensing unit SU surround the first and third branch portions SP2c1 and SP2c3, and the second portions SP1a of the first sensing portion SP1 disposed on the right side of the sensing unit SU surround the second and fourth branch portions SP2c2 and SP2c4.

The first portions SP1b of the first sensing portions SP1 are spaced apart from each other in the first direction DR1 with the second intermediate portion BP2 therebetween. The first intermediate portion BP1 electrically connects the spaced apart first sensing portions SP1. FIG. 9B illustrates two first intermediate portions BP1 disposed in the sensing unit SU. However, the number of first intermediate portions BP1 disposed in the sensing unit SU is not necessarily limited thereto, and one, three or more first intermediate portions BP1 may be disposed in the sensing unit SU.

As illustrated in FIG. 9B, the first intermediate portion BP1 has a broken-line shape, such as "/\" or "\/", on the plane. The first intermediate portion BP1 overlaps the second sensing portions SP2. However, without necessarily being limited thereto, the first intermediate portion BP1 may have the shape of a straight line that extends in the first direction DR1 and may overlap the second intermediate portion BP2 on the plane.

Dummy patterns DUP are electrically floated patterns. The dummy patterns DUP are insulated from the first sensing electrodes E1-1 to E1-6 and the second sensing electrodes E2-1 to E2-4. The dummy patterns DUP include first to fourth dummy patterns DUP1 to DUP4, depending on positions thereof.

The first dummy patterns DUP1 are disposed between the first sensing electrodes E1-1 to E1-6 and the second sensing electrodes E2-1 to E2-4. For example, the first dummy patterns DUP1 are disposed between the first sensing portions SP1 and the second sensing portions SP2. For example, as illustrated in FIG. 9B, the first dummy patterns DUP1 are disposed between the second portions SP1a of the first sensing portions SP1 and the branch portions SP2c1 to SP2c4 of the second sensing portions SP2 and surround the branch portions SP2c 1 to SP2c4.

The first dummy patterns DUP1 includes a plurality of patterns that are electrically insulated from each other. The sizes of the plurality of patterns varies depending on the sensing units SU in consideration of mutual capacitance and visibility. However, embodiments of the first dummy patterns DUP1 are not necessarily limited thereto.

The second dummy patterns DUP2 are surrounded by the second extending portions SP2b of the second sensing portions SP2 described above. The third dummy patterns DUP3 are surrounded by the first sensing portions SP1. The fourth dummy patterns DUP4 are disposed between the first sensing electrodes E1-1 to E1-6. However, according to an embodiment, at least some of the first to fourth dummy patterns DUP1 to DUP4 are omitted.

According to embodiments of the present disclosure, an electronic device can detect a defect occurring in the wiring of the input sensor.

When the wiring of the input sensor is damaged, the sensing line is opened, and the electronic device detects the opening of the sensing line, thereby detecting a defect.

While embodiments of the present disclosure have been described with reference to drawings thereof, it will be apparent to those of ordinary skill in the art that various changes and modifications may be made thereto without departing from the spirit and scope of embodiments of the present disclosure as set forth in the following claims.

What is claimed is:

1. An electronic device, comprising:
   a display panel that displays an image; and
   an input sensor disposed on the display panel, wherein the input sensor includes an active area that senses an external input and a peripheral area adjacent to the active area,
   wherein the input sensor further includes:
   a sensing electrode disposed in the active area;
   a signal line disposed in the peripheral area and electrically connected with the sensing electrode;
   a ground line disposed in the peripheral area, wherein the ground line is further away from the active area than the signal line;
   a sensing line that includes a first portion that overlaps the ground line in a thickness direction of the input sensor;
   a signal pad disposed in the peripheral area and electrically connected with the signal line;
   a ground pad disposed in the peripheral area and electrically connected with the ground line; and
   a dummy pad disposed adjacent to the ground pad,
   wherein one end of the sensing line is connected with the dummy pad and an opposite end of the sensing line is connected with the ground line.

2. The electronic device of claim 1, wherein the display panel includes:
   a display substrate that includes a pixel;
   an encapsulation substrate disposed on the display substrate and that covers the pixel; and
   a sealing member that bonds the display substrate and the encapsulation substrate to each other,
   wherein the encapsulation substrate is a base substrate of the input sensor.

3. The electronic device of claim 1, wherein the input sensor further includes:
   a base substrate;
   a first insulating layer disposed on the base substrate, wherein the sensing electrode is disposed on the first insulating layer; and
   a second insulating layer disposed on the first insulating layer.

4. The electronic device of claim 3, wherein the signal line and the ground line are disposed on the base substrate and the sensing line is disposed on the same layer as the sensing electrode.

5. The electronic device of claim 4, wherein the opposite end of the sensing line is electrically connected with the ground line through a contact hole that penetrates the first insulating layer.

6. The electronic device of claim 1, wherein the peripheral area includes a pad area on which the signal pad, the ground pad, and the dummy pad are disposed, and
   wherein the dummy pad is disposed at an outermost position in a first direction irn the pad area.

7. The electronic device of claim 6, wherein the sensing line further includes a second portion that extends from the first portion and is disposed in the pad area, and at least part of the second portion does not overlap the ground line in the thickness direction.

8. The electronic device of claim 1, wherein the dummy pad includes a plurality of dummy pads, and the sensing line is electrically connected with a dummy pad of the plurality of dummy pads that is closest to the ground pad.

9. The electronic device of claim 8, wherein the plurality of dummy pads are electrically connected together.

10. The electronic device of claim 1, wherein the input sensor further includes a guard line disposed on the peripheral area, wherein the guard line is located between the signal line and the ground line.

11. The electronic device of claim 1, wherein the sensing line includes a line portion that connects the one end and the opposite end, and
wherein the opposite end of the sensing line makes contact with the ground line, anal line portion does not make contact with the ground line.

12. The electronic device of claim 1, wherein the display panel further includes a thin film encapsulation layer, and the input sensor is disposed directly on the thin film encapsulation layer.

13. The electronic device of claim 1, wherein the sensing electrode includes a first sensing electrode that extends in a first direction and a second sensing electrode that extends in a second direction that crosses the first direction, and
wherein the signal line includes a first signal line connected with the first sensing electrode and a second signal line connected with the second sensing electrode.

14. An electronic device, comprising:
a display panel that display an image; and
an input sensor disposed on the display panel, wherein the input sensor includes an active area that senses an external input and a peripheral area adjacent to the active area,
wherein the input sensor further includes:
a sensing electrode disposed in the active area;
a signal line disposed in the peripheral area and electrically connected with the sensing electrode;
a first ground line and a second ground line spaced apart from each other with respect to the active area and disposed in the peripheral area outward of the signal line;
a first sensing line and a second sensing line that overlap the first ground line and the second ground line, respectively, in a thickness direction of the input sensor;
a signal pad disposed in the peripheral area and connected with the signal line;
a first ground pad and a second ground pad disposed in the peripheral area and connected with the first ground line and the second ground line, respectively; and
a first dummy pad and a second dummy pad disposed in the peripheral area adjacent to the first ground pad and the second ground pad, respectively, and
wherein one end of the first sensing line is connected with the first dummy pad and an opposite end of the first sensing line is connected with the first ground line, and one end of the second sensing line is connected with the second dummy pad and an opposite end of the second sensing line is connected with the second ground line.

15. The electronic device of claim 14, wherein the input sensor further includes:
a base substrate on which the signal line and the first and second ground lines are disposed;
a first insulating layer disposed on the base substrate and on which the sensing electrode and the first and second sensing lines are disposed; and
a second insulating layer disposed on the first insulating layer and that covers the sensing electrode and the first and second sensing lines.

16. The electronic device of claim 15, wherein the opposite ends of the first and second sensing lines are electrically connected with the first and second ground lines through contact holes formed through the first insulating layer.

17. The electronic device of claim 14, wherein the peripheral area includes a pad area on which the signal pad, the first and second ground pads, and the first and second dummy pads are disposed,
wherein the first dummy pad and the second dummy pad are spaced apart from each other in a first direction with respect to the first and second signal pads, and
wherein the first ground pad is disposed between the first dummy pad and the signal pad, and the second ground pad is disposed between the second dummy pad and the signal pad.

18. The electronic device of claim 17, wherein the first dummy pad includes a plurality of first dummy pads, and the second dummy pad includes a plurality of second dummy pads, and
wherein the first sensing line is electrically connected with a first dummy pad of the plurality of first dummy pads that is closest to the first ground pad, and the second sensing line is electrically connected with a second dummy pad of the plurality of second dummy pads that is closest to the second ground pad.

19. An electronic device, comprising;
a display panel that displays an image; and
an input sensor disposed on the display panel, wherein the input sensor includes an active area that senses an external input and a peripheral area adjacent to the active area,
wherein the input sensor further includes;
a sensing electrode disposed in the active area;
a signal line disposed in the peripheral area and electrically connected with the sensing electrode;
a ground line disposed in the peripheral area, wherein the ground line is further away from the active area than the signal line;
a sensing line disposed in the peripheral area and that includes a first portion that overlaps the ground line in a thickness direction of the input sensor;
a ground pad disposed in the peripheral area and that is connected with the ground line; and
a dummy pad disposed in the peripheral area adjacent to the ground pad,
wherein the ground pad and the dummy pad are electrically connected with each other by the sensing line.

20. The electronic device of claim 19, wherein one end of the sensing line is electrically connected with the dummy pad and an opposite end of the sensing line is electrically connected with the ground line, wherein the opposite end is opposite to the one end.

* * * * *